(12) United States Patent
Chapman

(10) Patent No.: US 8,352,890 B2
(45) Date of Patent: Jan. 8, 2013

(54) METHOD FOR READING POLYGON DATA INTO AN INTEGRATED CIRCUIT ROUTER

(76) Inventor: David C. Chapman, San Jose, CA (US)

( * ) Notice: Subject to any disclaimer, the term of this patent is extended or adjusted under 35 U.S.C. 154(b) by 315 days.

(21) Appl. No.: 12/702,996

(22) Filed: Feb. 9, 2010

(65) Prior Publication Data

US 2010/0205570 A1   Aug. 12, 2010

Related U.S. Application Data

(60) Provisional application No. 61/150,657, filed on Feb. 6, 2009.

(51) Int. Cl.
*G06F 17/50* (2006.01)
(52) U.S. Cl. ........... 716/55; 716/126; 716/129; 716/130
(58) Field of Classification Search .................... 716/55, 716/126, 129, 130
See application file for complete search history.

(56) References Cited

U.S. PATENT DOCUMENTS

2009/0039263 A1* 2/2009 Matsuoka et al. ............ 250/311

* cited by examiner

*Primary Examiner* — Vuthe Siek
(74) *Attorney, Agent, or Firm* — Hickman Palermo Truong Becker Bingham Wong LLP; Edward A. Becker

(57) ABSTRACT

An approach is provided for converting a polygon described as an ordered list of perimeter points into a set of connected quadrilaterals suitable for use in an advanced integrated circuit router. Edges are constructed between the points of the polygon. Then, one or more edges are selected as starting locations. Pairs of edges or portions of pairs of edges are matched to form sequences of quadrilaterals. Methods are provided to determine when edges should be split or skipped to ensure that all quadrilaterals are convex or meet other criteria. Other methods are provided to determine when the matching process should be terminated and restarted at another location. Finally, the sequences of quadrilaterals are joined together to form a data structure suitable for use within an integrated circuit router.

20 Claims, 18 Drawing Sheets

US 8,352,890 B2

METHOD FOR READING POLYGON DATA INTO AN INTEGRATED CIRCUIT ROUTER

RELATED APPLICATION AND CLAIM OF PRIORITY

This application claims the benefit of, and priority to, U.S. Provisional Patent Application No. 61/150,657, entitled "Method For Reading Polygon Data Into An Integrated Circuit Router", filed Feb. 6, 2009, the content of which is incorporated by reference in its entirety for all purposes as if fully set forth herein.

FIELD OF THE INVENTION

The invention relates to the design of integrated circuits, and more specifically, to a method and apparatus for loading complex polygon data into an integrated circuit router.

BACKGROUND

Ideally, integrated circuits are routed using a single tool, able to manage both large-scale resource allocation and the complex design rules of the integrated circuit fabrication facility. Often, the tradeoffs made by the developers of a full-chip integrated circuit router lead to problems that the router cannot resolve. In these situations the router terminates leaving unrouted wires or wires that do not meet all of the design rules. Most of the design may have been completed, so it would be advantageous to be able to read in only the portions that are known to have problems and send them to an advanced small-scale router.

The smallest circuit elements of integrated circuits, known as leaf cells, are often constructed manually by layout designers. Productivity could be increased if unrouted or partially routed leaf cells could be sent to an advanced small-scale router for completion, but the polygons of these cells are generally not in the preferred format for the routing tool. The layout designer might have merged all overlapping polygons, for example, or might have drawn wires using 45 degree angles instead of the 90 degree angles preferred by most automated integrated circuit routers. Thus it would be advantageous to be able to read polygons of arbitrary shape and convert them to a representation preferred by an integrated circuit router.

Within an integrated circuit router that performs design rule checks as it constructs the routing, overlaps between polygons on the same layer increase the complexity of the software routines which perform the checks, as there are many distinct ways in which overlaps may occur. It is much simpler to disallow overlaps, either by using a single polygon for each wire or by providing for carefully constrained abutments between individual polygons that together will form a wire.

Even when overlaps are disallowed, the polygons within such a router may be complex, especially near a connection point such as a contact to another layer. Routing paths may approach the connection point from multiple directions, including angles that are odd multiples of 45 degrees, and may be offset from the center line of the connection point. Because efficient design rule checks often rely on constrained data representations such as rectangles, trapezoids, or other quadrilaterals, it is advantageous to convert complex polygon shapes to these data representations.

Polygons in an integrated circuit are not completely arbitrary. Routing polygons in particular tend to have portions that are long and thin with parallel sides, conducting signals from one portion of the integrated circuit to another. This suggests a heuristic of using current flow direction, such as is computed during resistance extraction, to partition the polygon. Sections with parallel sides can quickly be converted to the desired data representation. What remains are width changes, bends, wire ends, and junctions.

An early approach that traces pairs of polygon edges to find straight routing stretches is described in "PANAMAP-1: A Mask Pattern Analysis Program for IC/LSI" by T. Ozaki, J. Yoshida, and M. Kosaka in the Proceedings of the 1980 International Symposium on Circuits and Systems, pp. 1020-1026 and "PANAMAP-B: A Mask Verification System for Bipolar IC" by J. Yoshida, T. Ozaki, and Y. Goto in the Proceedings of the 1981 Design Automation Conference, pp. 690-695. Here the center lines of the straight regions are traced to determine the path length; the width of each region is used to estimate the resistance. Corrections for complex shapes such as bends or junctions are determined experimentally. No methods for using the center lines for automation of routing are described.

A partitioning approach was suggested in "Resistance Extraction from Mask Layout Data," by Mark Horowitz and Robert Dutton, as printed in IEEE Transactions on Computer-Aided Design, July 1983, pp. 145-150. This paper describes the construction of "break lines" at concave corners of the polygon. The method is used only for resistance extraction; in particular it does not guarantee that the shapes resulting from partitioning will have any particular configuration. The only guarantee is that they will have at most eight sides. This is not suitable for use in a router that uses a data representation comprising a single type of shape such as a quadrilateral.

A polygon partitioning method was described in "REX—A VLSI Parasitic Extraction Tool for Electromigration and Signal Analysis," by Jerry Hwang, Proceedings of the 1991 Design Automation Conference, pp. 717-722. It also generates shapes with an arbitrary number of sides; FIG. 3 on page 719 shows that it has generated a triangle.

U.S. Pat. No. 6,167,555, "System and Method for Converting Polygon-Based Wires of an Integrated Circuit Design to Path-Based Wires," also uses the method of converting parallel sides of a polygon to wires. If the polygon shape is irregular, it either discards some geometric information or creates a series of non-quadrilateral shapes, e.g. L or T objects, that are not necessarily connected in a sequence. This makes the shapes unsuitable for direct use within present integrated circuit routers. The algorithm also changes the input data in arbitrary ways to meet its own requirements, e.g. that the centerline for a routing path be on grid.

In view of the need to represent complex polygons in the preferred data structures of integrated circuit routers and the limitations in existing approaches, an alternative approach for importing polygon data into an integrated circuit router is highly desirable.

SUMMARY

According to one aspect of the invention, an approach is provided for converting a polygon described as an ordered list of perimeter points into a set of connected quadrilaterals suitable for use in an advanced integrated circuit router. The computer system comprises a memory and one or more processors coupled to the memory. The memory contains instructions which, when processed by the one or more processors, cause several steps to occur. First, edges are constructed between the points of the polygon. Then, one or more edges are selected as starting locations. Pairs of edges or portions of pairs of edges are matched to form sequences of quadrilaterals. Methods are provided to determine when edges should be split or skipped to ensure that all quadrilaterals are convex or meet other criteria. Other methods are provided to determine when the matching process should be terminated and restarted at another location. Finally, the sequences of quadrilaterals are joined together to form a data structure suitable for use within an integrated circuit router.

According to another aspect of the invention, an approach is provided for converting polygon data generated by a chip-level integrated circuit router into sequences of connected quadrilaterals suitable for use in an advanced local area router, and then joining the sequences to form a data structure suitable for use within an integrated circuit router.

According to yet another aspect of the invention, an approach is provided for converting polygon data from join point generators to sets of connected quadrilaterals suitable for use in an advanced local area router, and then joining the sequences to form a data structure suitable for use within an integrated circuit router.

DETAILED DESCRIPTION

Figure 1:
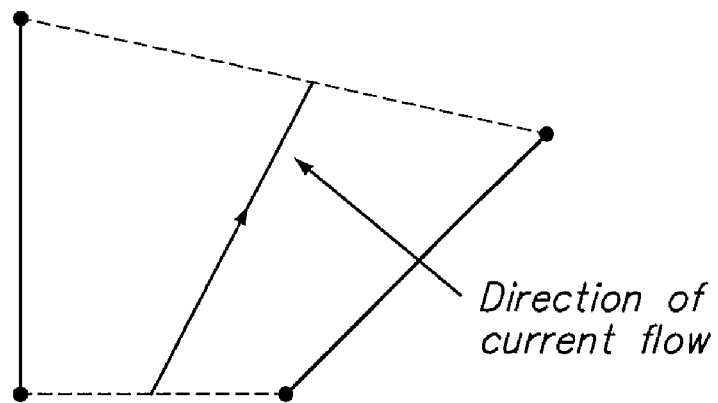
FIG. 1 illustrates current flow direction within a portion of an integrated circuit conductor.

The use of sequences of quadrilaterals to represent routing and other integrated circuit data is advantageous because current flow direction can be approximated using a centerline of each quadrilateral, as shown in FIG. 1. If every side has a non-zero length, the direction of each side can be computed unambiguously. Such a representation is described in U.S. Pat. No. 6,128,767, "Polygon Representation in an Integrated Circuit Layout," the contents of which are hereby incorporated by reference in its entirety for all purposes. While some of the descriptions herein use the representation of this patent, they can be applied to any representation that uses quadrilaterals or wire segments that span the breadth of a conductor path.

Figure 2:
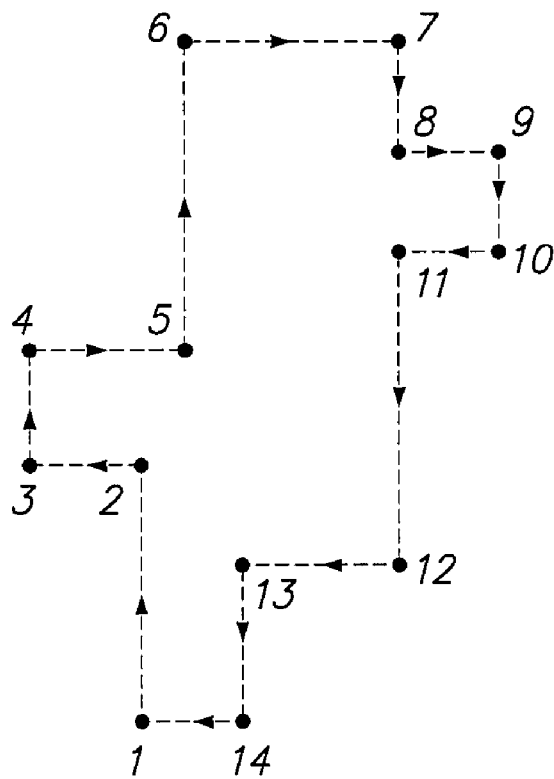
FIG. 2 illustrates a list of points representing a polygon used as input to an embodiment of the invention.

In plane geometry mathematics, polygons are often represented as an ordered series of coordinate pairs, with an implied line segment between each pair of coordinates as shown in FIG. 2. The numbers represent the point indices, and the line segments traverse from lower numbered indices to higher numbered indices, except at the end where the final line segment traverses from point 14 back to point 1.

For convenience, it is assumed that the line segments of the polygon trace around the polygon in a clockwise direction as shown in FIG. 2, but the methods described herein apply equally well to polygons in which the line segments trace in a counterclockwise dimension. Well-known plane geometry methods can be used to determine whether the line segments traverse in a clockwise or counterclockwise direction, and to reverse the ordering of the points in the latter case.

Figure 3:
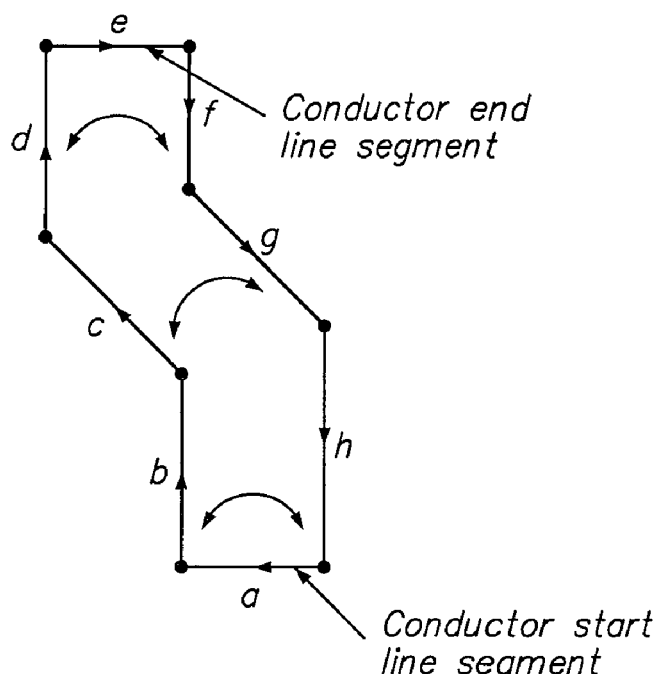
FIG. 3 illustrates candidate conductor starting and ending edges, plus pairwise edge matching, for a polygon processed by an embodiment of the invention.

The general method for converting polygon data into a representation suitable for use by an integrated circuit router is as follows: a candidate conductor start line segment is selected, and the two line segments immediately before and after it become the first pair of line segments matched in the conductor tracing process. The line segment immediately following the candidate conductor start line segment is matched with the line segment immediately before the candidate conductor start line segment. This matching process continues pair by pair until a stopping condition is met. In FIG. 3, arrows are drawn between pairs of matched line segments. Line segments b and h are a matched pair; line segments c and g are a matched pair; line segments d and f are a matched pair; line segment a is a candidate conductor start line segment; and line segment e is a candidate conductor end line segment.

Typically, no a priori knowledge of the shape of the polygon is available. Its expected conductor width is not known, and the selection of the first point in the coordinate pair list is arbitrary. Thus it is not possible to determine a candidate conductor start line segment by examining its length or position in the line segment list. As a result, any method which traces conductors must first identify candidate conductor start line segments.

Figure 4:
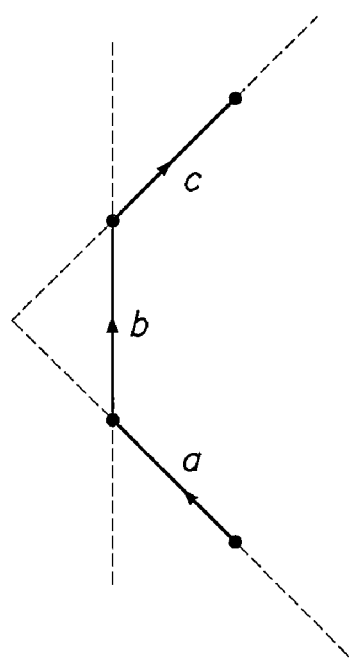
FIG. 4 illustrates how a candidate conductor starting or ending edge may be identified by an embodiment of the invention.

According to one embodiment of the invention, for a polygon whose line segments trace in a clockwise direction, candidate conductor start line segments are identified by looking for a sequence of three line segments such the second line segment is "to the right of" the first using a half plane check, and the third line segment is "to the right of" the second. In FIG. 4, line segment a is the first line segment, line segment b is the second line segment, and line segment c is the third line segment. In this example, line segment b is the candidate conductor start line segment. Dashed lines represent the extensions of the line segments used for the half plane checks.

Figure 5:
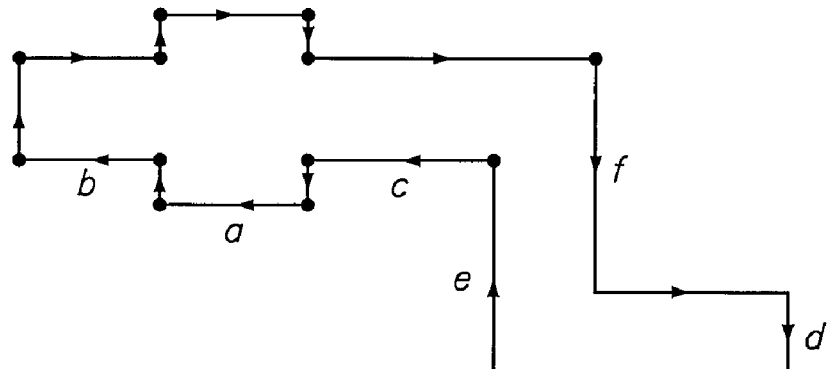
FIG. 5 illustrates candidate conductor starting edges for a polygon processed by an embodiment of the invention.

Each such set of three line segments identifies a locally convex region of the polygon. There may be many such convex regions, and not all of them are ideal conductor start line segment candidates. In FIG. 5, for example, candidate a is not ideal, because the second adjacent line segments b and c diverge and thus no centerline can be constructed. Candidate d is much better because the second adjacent line segments e and f are parallel to each other. In an embodiment of the invention, all of the candidate conductor start line segments of the polygon are ordered so that better candidates, as determined by possibly multiple criteria, are examined first.

A single traversal through all of the points in the polygon is sufficient to identify all initial candidate conductor start line segments. The runtime of this algorithm is proportional to the number of the line segments in the polygon. This is significantly faster than the method disclosed in U.S. Pat. No. 6,167,555, which uses an algorithm with a runtime proportional to the square of the number of line segments in the polygon.

If the polygon must be partitioned due to data representation or external requirements, additional candidate conductor start line segments may be created; these are added to the sorted list as well.

Once a candidate conductor start line segment is selected, adjacent line segments are paired, one on each side, until a conductor ending line segment is reached or an invalid quadrilateral is created. There are several different ways in which an invalid quadrilateral can be created, and a different repair mechanism may be used for each.

Figure 6A:
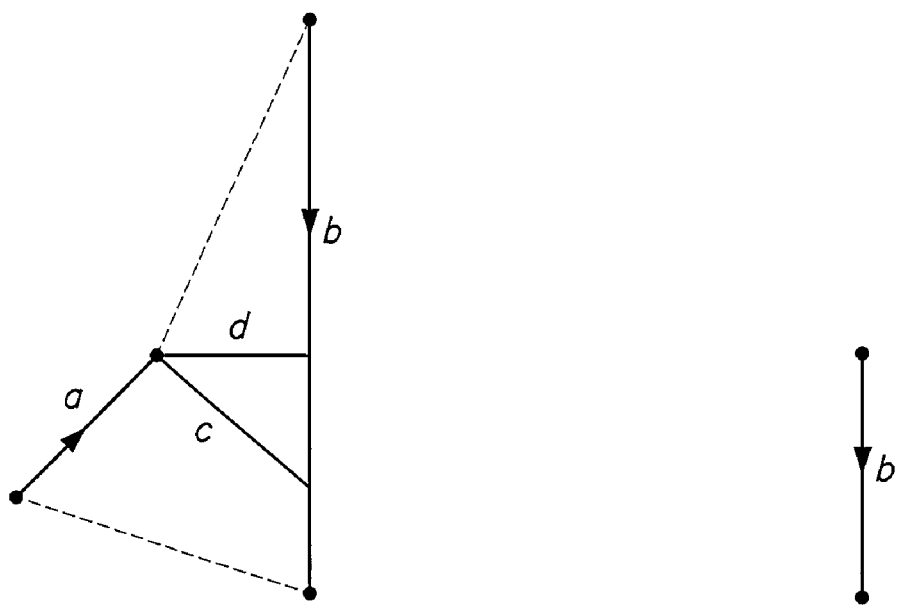
FIG. 6(a) illustrates how a concave quadrilateral may be converted to a convex quadrilateral by an embodiment of the invention.
Figure 6B:
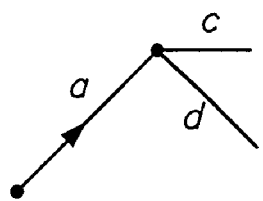
FIG. 6(b) illustrates a concave quadrilateral that cannot be converted to a convex quadrilateral.

Generally, quadrilaterals in a polygon data representation are convex (all interior angles less than 180 degrees). If a pair of matched line segments forms a concave quadrilateral, one of the line segments must be shortened to repair the error. In FIG. 6(a), the matched line segments a and b form a concave quadrilateral. Any of a number of criteria may be used to determine the length by which the line segment is shortened. For example, the point may be chosen so that one of the angles of the quadrilateral is exactly 90 degrees. Line c in FIG. 6(a) is chosen to be perpendicular to the left matched line segment a, while line d is chosen to be perpendicular to the right matched line segment b. One or both of these choices may be invalid if the matched line segments are not opposing each other. In FIG. 6(b), the matched line segments a and b form a concave quadrilateral. Neither line c nor line d intersects the vertical line segment b, so no valid convex quadrilateral can be created. In this case other repair mechanisms are necessary.

Figure 7A:
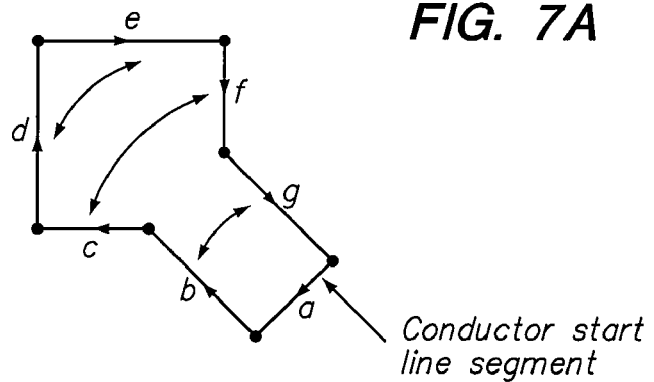
FIGS. 7(a)-7(c) illustrate how a new line segment may be inserted by an embodiment of the invention.

If the number of line segments on one side of the traced conductor is lower than the number of line segments on the other side, or if the matched line segments are not perfectly synchronized as the matching process reaches the end of the conductor, the final quadrilateral would become a triangle, as shown in FIG. 7(a). Line segment a is the candidate conductor start line segment; line segments b and g are matched; line segments c and f are matched; and line segments d and e would be matched except that the result would not be a quadrilateral.

Figure 7B:
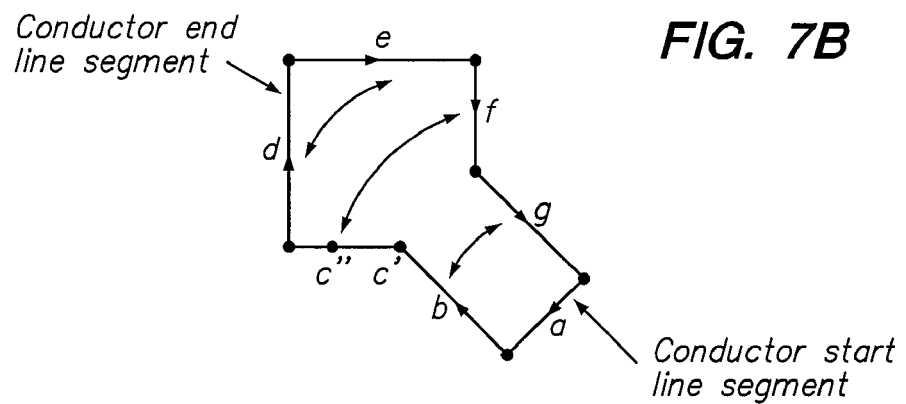

This is repaired by shortening one of the line segments by an arbitrary distance greater than zero but less than the length of the line segments, as shown in FIG. 7(b). Here line segment c has been split into two line segments c' and c"; line segment c' is matched with line segment f; line segment c" is matched with line segment e; and line segment d is the conductor end line segment. Equivalently line segment f could have been split; line segment e would then have become the conductor end line segment. In one embodiment of the invention, certain line segments are marked "must be wire start or end segment" or "must be wire side segment," so the choice of line segment to split is sometimes forced.

Figure 7C:
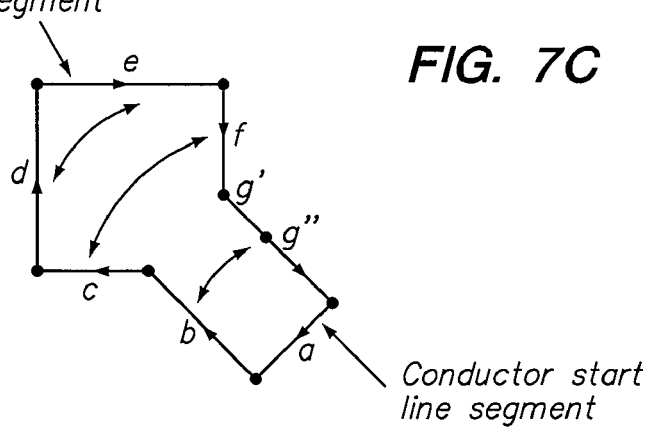

In highly constrained conditions, it can be advantageous to split an earlier line segment, as shown in FIG. 7(c). Here line segment g has been split into two line segments g' and g"; line segment g" is matched with line segment b; line segment g' is matched with line segment c; line segment d is matched with line segment f; and line segment e is the conductor end line segment. In one embodiment of the invention, certain line segments may be marked "do not split," so it is sometimes necessary to back up, separating already-matched pairs, to find a line segment that can be split. The point inserted into line segment g is above the start point of line segment c, so the quadrilateral formed by line segments c and g' is convex. Had no such point been available, it would have been necessary to back up still further or even select a new candidate conductor start line segment.

Figure 8A:
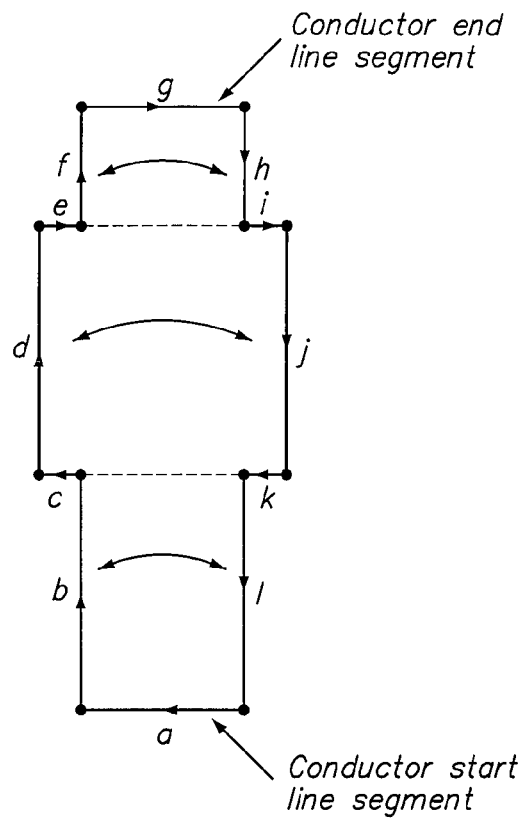
FIGS. 8(a)-8(b) illustrate polygons with divergent edges that can be processed by an embodiment of the invention.

As described above, if the matched pair of line segments diverges at an angle of 180 degrees, it is not possible to compute a centerline or form a convex quadrilateral. The same problem arises if the matched pair of line segments converges at an angle of zero degrees. In both cases, it is often possible to continue anyway by looking forward to the next pair of line segments. If the current pair of line segments are colinear and the next pair of line segments are convex, a new quadrilateral can be formed that does not overlap the quadrilateral formed by the previous pair of line segments, as shown in FIG. 8(a). Here line segment a is the conductor start line segment; line segments b and l are matched; line segments d and j are matched; line segments f and h are matched; and line segment g is the conductor end line segment. Line segments c, e, i, and k are skipped because they are colinear. As a result, portions of the ends of the middle quadrilateral are exposed.

Figure 8B:
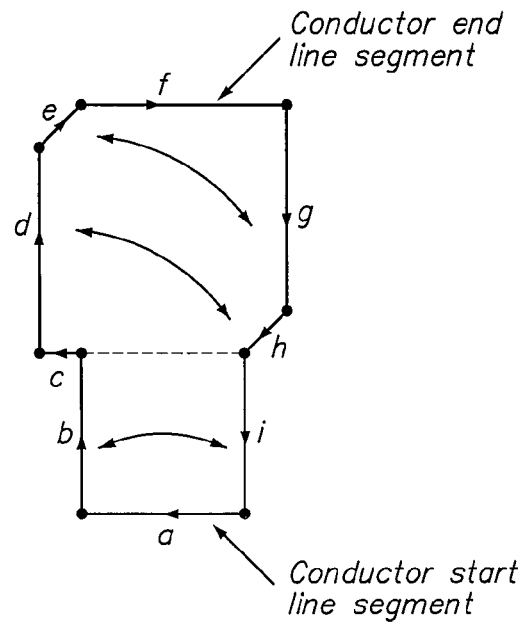

If only one of a matched pair of line segments is colinear with the appropriate endpoint of the other, that line segment can be skipped singly, as seen in FIG. 8(b). Here line segment c is colinear with the lower endpoint of line segment h, so it is not possible to form a convex quadrilateral by matching them. Instead, line segment c is skipped and line segment d is matched with line segment h. Pairwise matching continues from this point, matching line segments e and g before ending at line segment f.

Had there been no diagonal line segment in the upper left corner of FIG. 8(b), i.e. if line segments d and f were connected directly, then matching of line segments f and g would have failed and one of these line segments would have been clipped. The adaptive mechanisms described in this application can be applied together as necessary.

The example here shows a colinear edge c on the left side of the figure; similar logic applies when the colinear edge is on the right side of the figure.

If the lengths of the colinear line segments are significant, they may represent a junction instead of a change in the width of the current conductor. In an embodiment of the invention, the quadrilaterals are wire segments within wires that may in turn be connected at their ends. It is thus possible to select a line between the current pair of matched line segments, terminate processing of the conductor, create a new line segment list to contain the processed line segments, insert a new line segment along the selected line in each of the two lists, and remember the connection between the two lists. In an embodiment of the invention, an end of a first wire can connect only to the side of a second wire. To ensure that this rule is met, the newly created line segment in the list of unprocessed line segments is marked "must be wire side segment" and the newly created edge in the list of processed line segments is marked "must be wire start or end segment."

In an embodiment of the invention the process of termination, separation, and remembrance is known as "slicing." In some slicing operations one or both of the current processed line segments may be split first, for example to ensure that the new line segment is at an angle that is an integral multiple of 45 or 90 degrees.

Figure 9A:
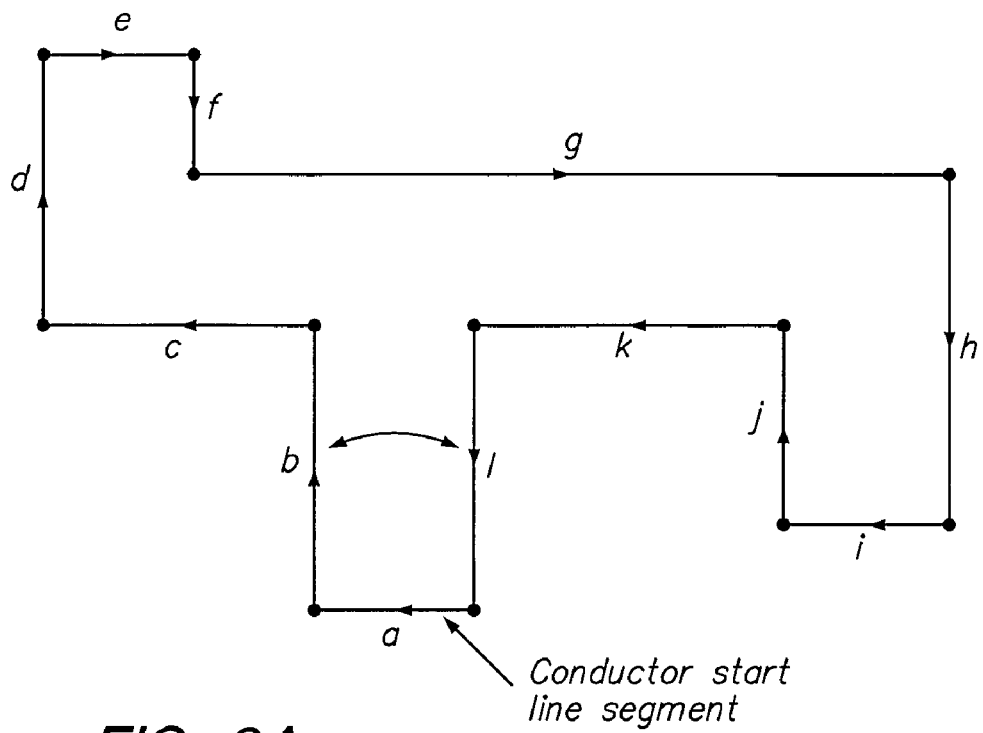
FIGS. 9(a)-9(b) illustrate a polygon with divergent edges that result from a conductor junction, and its processing by an embodiment of the invention.

Termination of processing and insertion of a new line segment can also be used when the line segments following the colinear line segments do not form a convex quadrilateral, as shown in FIG. 9(a). This is also indicative of a junction instead of a change in width.

Figure 9B:
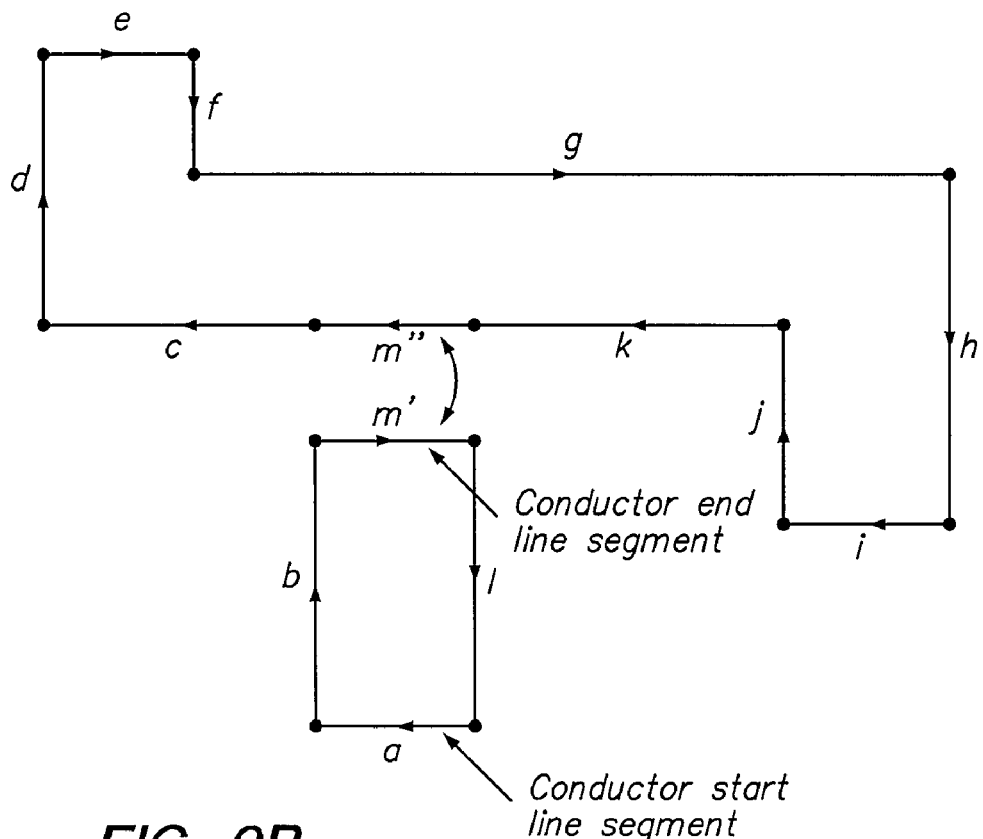

In FIG. 9(a), line segments b and l are matched. Line segments c and k are colinear and should be skipped, but line segments d and j will not form a convex quadrilateral because there would be a twist in it. It would also overlap the quadrilateral formed by line segments b and l. Instead, as shown in FIG. 9(b), the list of processed line segments is separated; a new line segment m' is added between line segments a and l, and a new line segment m" is added between line segments c and k. In an embodiment of the invention, line segment m' is marked "must be wire start or end segment" and line segment m" is marked "must be wire side segment." Line segment m' has a rightward direction to be consistent with the direction of the lower line segment list and line segment m" has a leftward direction to be consistent with the direction of the upper line segment list.

Insertion of "must be wire side" and "must be wire start or wire end" line segments means that many of the above discussions, e.g. finding candidate conductor start line segments, will actually be examining colinear sequences of line segments instead of single line segments. For example, there might be three colinear line segments, one of which is marked "must be wire start or end segment," considered as a candidate conductor start line segment sequence. If either of the line segments immediately adjacent to this line segment sequence is marked "must be wire start or end segment," then the sequence cannot be used as a candidate conductor line start sequence. Instead, it will have to be sliced if possible. Should that not be possible due to other constraints, an error condition indicating the location of the problem will be returned.

For example, line segment m" in FIG. 9(b) cannot be used as part of a candidate conductor start line segment sequence because it is marked "must be wire side segment."

In similar fashion, when matching pairs of line segments, colinear line segments such as line segments c, m", and k in FIG. 9(b) can be treated as a single line segment for the purposes of creating a quadrilateral. In FIG. 9(b), these three edges would be matched with line segment g to form a single quadrilateral. In an embodiment of the invention, there may be multiple "must be wire side segment" line segments in a colinear sequence.

Generally, a series of colinear line segments is treated as a single line segment wherever possible, as described above for matching line multiple line segments to form a single quadrilateral.

"Must be wire start or end segment" and "must be wire side segment" marks may also be present on line segments when processing of the polygon first begins, if there are additional external requirements for conversion of the polygon into quadrilaterals.

It can be seen that the process of converting the complex polygon of FIG. 9(a) into quadrilaterals has been transformed into two much simpler processes, one of converting the lower center line segment list into a single quadrilateral, and one of converting the remaining line segments into a sequence of three quadrilaterals, starting either at line segment e or at line segment i. In an embodiment of the invention, the two sets of quadrilaterals (each contained in a wire comprising a sequence of wire segments) would then be linked, the single quadrilateral in the lower center of FIG. 9(b) connected to the side of the middle quadrilateral in the upper center of FIG. 9(b).

Figure 10A:
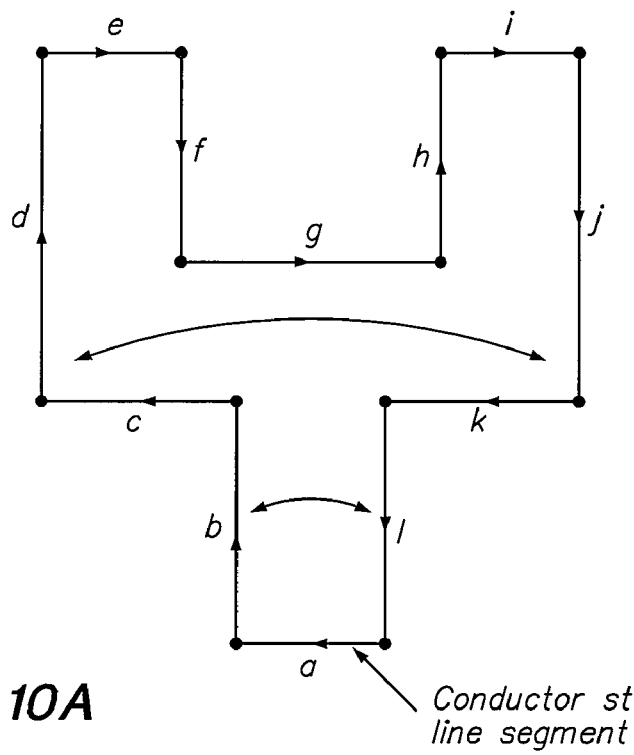
FIGS. 10(a)-10(b) illustrate another polygon with divergent edges that result from a conductor junction, and its processing by an embodiment of the invention.
Figure 10B:
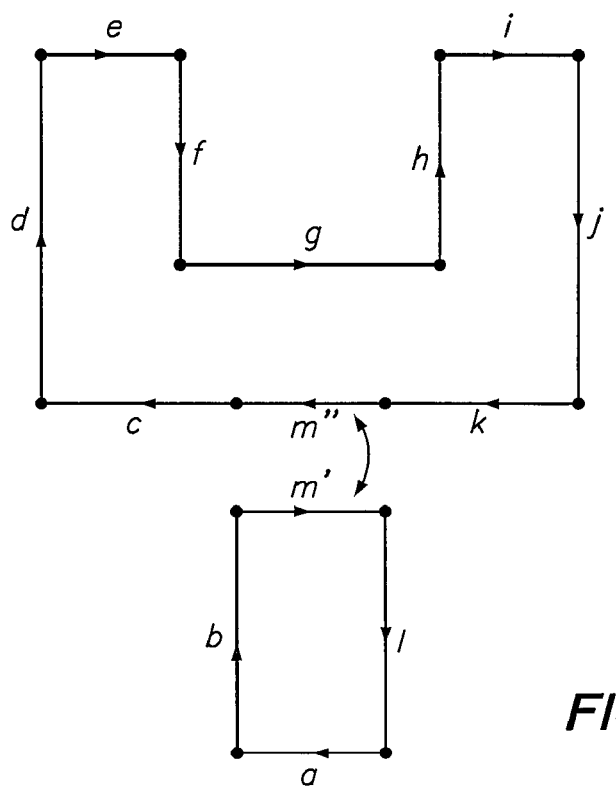

Sometimes problems such as concave quadrilaterals are not immediately obvious but are only discovered after additional matching has been performed. In FIG. 10(a), line segments b and l are matched, line segments c and k are skipped, and line segments d and j are matched. Line segments e and i will be skipped, and then it will be determined that the quadrilateral formed by line segments f and k will be illegal—line f is not to the left of line k when looking along the direction of line f (following the arrow). It is not possible to match line segments d and j at any value higher than line segment g. In an embodiment of the invention, matching of line segments d and j is reversed and the polygon is sliced. New line segments m' and m" are constructed colinear with line segments c and k, as shown in FIG. 10(b). Here only one slicing operation is necessary. It is also possible to slice on a line colinear with line segment g, creating one line segment list for each of the upright arms of the polygon, but the lower section would resemble a 'T' instead of a single continuous conductor, and the direction of current flow as estimated by the center line of the quadrilateral would not reflect the divergence of current that actually occurs.

It is also possible to slice vertically, for example colinear with line segment l, but this requires knowledge that line segments g and k can be matched without interference from any other line segments. Because there may be an arbitrary number of line segments along the list from line segment k to line segment g, determination of the suitability for a vertical slice could take an arbitrary amount of time. Success is by no means guaranteed even if no line segments interfere; the line segments adjacent to line segments g and k might not be suitable for matching.

No slicing line can cut through any line segment or separate two line segments in such a way that the shape of the polygon would be changed. For example, in FIG. 11 line segments d and l are matched but line segments f, g, h, i, and j form a concave section and thus prevent further matching. A horizontal slicing line to connect line segments d and l at location $y_3$ would cover a portion of line segment f and would completely cover line segments g and h, thus changing the shape of the polygon. A horizontal slicing line at location $y_2$ would cover portions of line segments f and h, and would completely cover line segment g. Only a slicing line at location $y_1$, colinear with line segment g and neither separating nor cutting any non-colinear line segment, would be valid.

According to one embodiment of the invention, to speed the search for line segments that would interfere with a slicing line, a region query system is used to locate line segments along a specific slicing line. Without such a system, every attempted slicing operation would have to examine every remaining unprocessed line segment. For a polygon with few line segments, the cost to set up of the region query system may be greater than the cost to check every line segment. Thus the number of line segments in the polygon can be counted and the region query system set up only if the count exceeds a threshold number.

Figure 11:
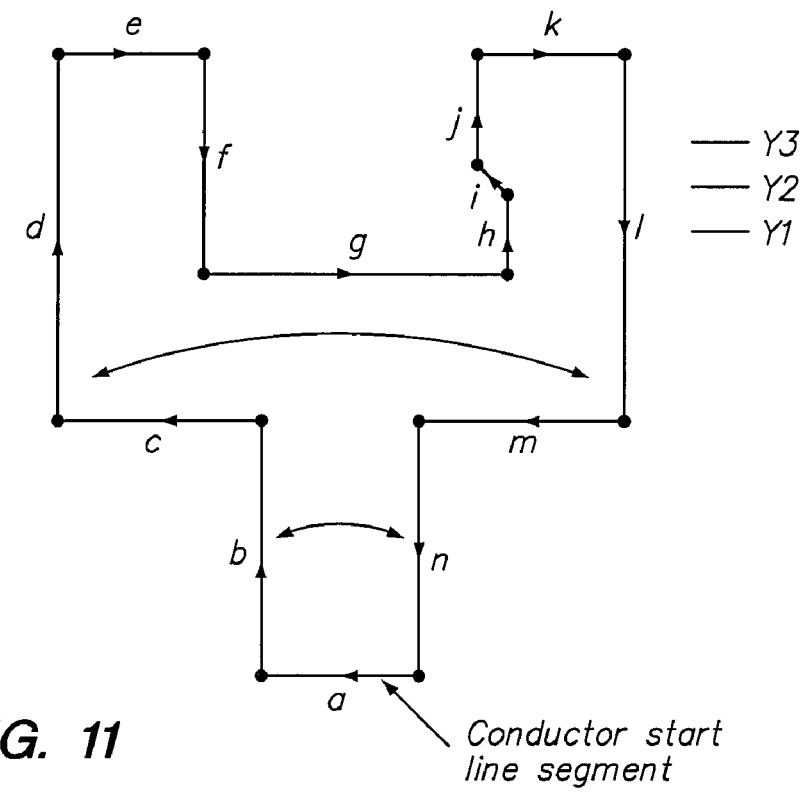
FIG. 11 illustrates potential slicing lines for a polygon being processed by an embodiment of the invention.

For example, in FIG. 11, the region query system would show that line segments d, f, h, and l are present along a horizontal line at location $y_2$.

In an embodiment of the invention where the quadrilaterals are wire segments connected end to end within a wire, if a line segment is marked "must be wire start or end segment" and is reached as part of a traversal of matched (side) line segments, corrective action is taken.

The marking represents a constraint, either imposed externally or as a result of an earlier slicing operation, that must not be violated. In similar fashion, no line segment marked "must be wire side segment" may be part of a candidate conductor start line (or line segment) or conductor end line (or line segment). If the end of a traversal results in a "must be wire side segment" as part of a conductor end line (or line segment), corrective action is taken.

The corrective action may be any of the methods described above, including insertion of additional points within nearby line segments, slicing, or starting the polygon import process over again from a different candidate conductor start line (or line segment). In an embodiment of the invention, all corrective actions valid at the point where the conflict is found are tried. The actions are attempted in an order based on their desirability.

Figure 12A:
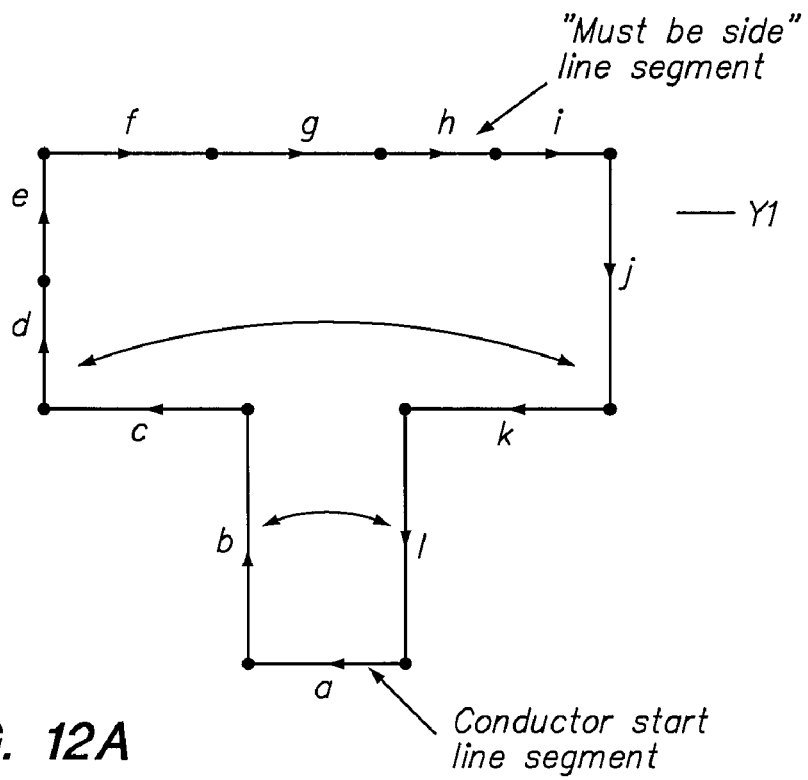
FIGS. 12(a)-12(b) illustrate how a polygon may be sliced by an embodiment of the invention to meet "must be side" edge constraints.

For example, in FIG. 12(a) line segments b and l are matched to each other, and initially line segments d and e are matched with line segment j. Once the line segment sequence (f, g, h, i) is examined, however, a conflict arises: two of the four line segments (f and h) are marked as "must be wire side segment." There are no additional line segments to import, so this line segment sequence can only serve as a conductor end line sequence unless a slicing operation is performed. Line segment d on the left side is also marked as "must be wire side segment," however, so the slice occurs at or above its upper end.

Figure 12B:
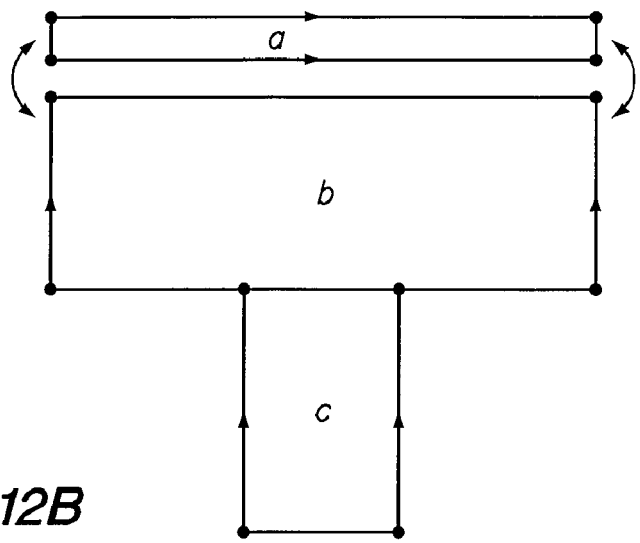

In an embodiment of the invention, a horizontal slicing line at location $y_1$, just below the line segment sequence (f, g, h, i), is used if possible. A thin polygon with line segment sequence (f, g, h, i) as its left side and a new horizontal "must be wire side segment" as its right side is created from the resulting line segment list. The result in an embodiment of this invention, a set of wires comprised of wire segments according to U.S. Pat. No. 6,128,767, is shown in FIG. 12(b). In this embodiment, multiple "must be wire side segment" line segments can be merged into a single wire segment side. Note that the sides of each wire segment proceed in much the same direction, unlike the line segments, which proceed up one side and down the other (i.e. clockwise around the polygon). There is a linkage between the right side of segment a in the upper (horizontal) wire and the upper end of segment b of the lower (vertical) wire.

A similar system may be defined for any polygon representation that uses quadrilaterals.

The wire segments of FIG. 12(b) are not oriented in the primary direction of current flow in the original polygon, which is irregular in shape and thus does not have a clearly defined direction of current flow in this area anyway. Application of the methods described here allows a partitioning of polygon data into regions for which the direction of current flow can be determined easily (relatively long and thin) and regions for which the direction of current flow cannot be determined easily, for which numerical methods such as those described in prior art are most suitable anyway.

Alternative actions may be tried at any time in the matching process so that problems identified further in the matching process may be resolved in a manner that allows them to be avoided entirely. For example, in FIG. 10(a), the colinear line segments c and k represent a problem to be resolved. Here the first action attempted is to skip them and match the next pair of line segments, d and j. Initially this seems to be a valid approach, but when line segments f and k are reached, an insoluble problem (a concave segment) is found. Alternatives in the matching process are attempted and fail, all the way back to line segments b and l; the next action attempted here is to slice at their end and restart the importation process at another candidate conductor start line segment (e.g. line segment e or i). The slicing action and restart are together successful in importing the polygon.

It is advantageous to minimize the number of slicing operations performed. Ideally every line segment could be matched in a single pass by traversing from the first candidate conductor start line. To maximize the probability that this will occur, all of the possible candidate conductor start lines are identified in a first pass through the line segment list, as described above, and put into an ordered list such that the first candidate is deemed the best.

In an embodiment of the invention, the lengths of the adjacent colinear line segment sequences are used to estimate the height of the first quadrilateral that would be generated for a given candidate conductor start line. The ratio of the height to the width is computed, measured perpendicular to the candidate conductor start line. A larger ratio, implying a longer conductor along the direction of current flow, is considered better than a smaller ratio. If both adjacent line segment sequences are perpendicular to the candidate conductor start line, the candidate is considered better than a candidate with an equivalent ratio but with one or both adjacent line segment sequences not perpendicular to the candidate start line. This is done so that line segment pairs that are more likely to be conductors (because they have parallel sides) are considered first. Line segment matching can of course proceed even if no line segment pairs with parallel sides are found.

Figure 13A:
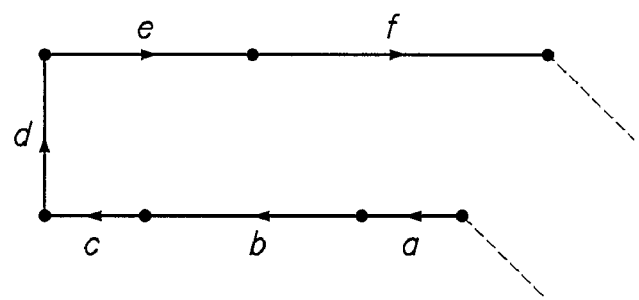
FIGS. 13(a)-13(b) illustrate how preference factors may be computed for candidate start line segments in an embodiment of the invention.

In FIG. 13(a) line segment d is the sole line segment in the candidate conductor start line; no other line segments are colinear with it. Line segments a, b, and c form the first adjacent line, while line segments e and f form the second adjacent line. The length of line segment d is 4 units; the total length of line segments a, b, and c is 11 units; and the total length of line segments e and f is 13 units. The minimum of these two lengths is chosen, so the aspect ratio is 11 divided by 4. In an embodiment of the invention the aspect ratio is converted to an integer by multiplying it by 64 and then truncating.

Figure 13B:
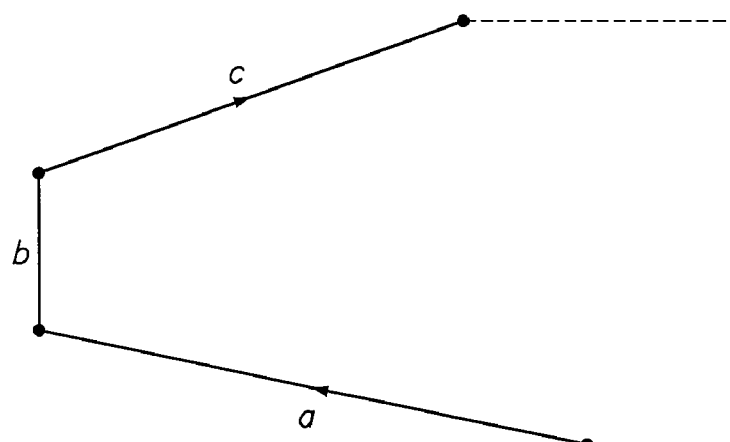

In FIG. 13(b) line segment b is the sole line segment in the candidate conductor start line; line segments a and c are the adjacent lines. The length of line segment a, measured perpendicular to line segment b, is 14 units; the length of line segment c, also measured perpendicular to line segment b, is 11 units. Although the measured depth of 11 units is the same as the candidate in FIG. 13(a), the candidate in FIG. 13(a) is preferable because it has parallel sides perpendicular to the candidate conductor start line. In an embodiment of the invention, the measured ratio is doubled if the previous adjacent line is perpendicular (e.g. line segments a, b, and c in FIG.

13(a)) and doubled again if the next adjacent line is perpendicular (e.g. line segments e and f in FIG. 13(a)). Alternative approaches may be used for computing a preference factor for such a situation.

The length of the lines adjacent to the candidate conductor start line excludes any "must be wire start or end segment" line segments that may be in the colinear sequence, as a slicing line would have to be inserted to force a direction change, as seen for example in FIG. 12(b). If such a line segment is immediately adjacent to the candidate conductor start line, the length will be zero, indicating an unsuitable candidate.

Figure 14A:
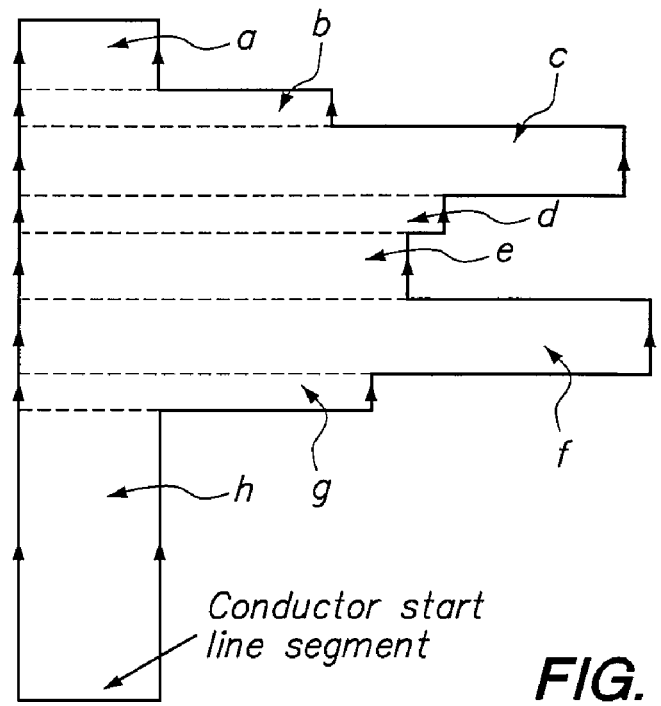
FIGS. 14(a)-14(d) illustrate a polygon with varying width and how it may be processed by an embodiment of the invention.

Because the expected conductor width of the polygon is generally not known, it can be difficult to distinguish a widening of the conductor path from a simple branch or a set of conductors perpendicular to the initial traversal direction. In FIG. 14(a), the traversal began from the lower line segment and proceeded upward. As each horizontal line segment was reached, the left vertical line segment was clipped. No invalid quadrilaterals were ever created, so there was never any need to slice the polygon.

Quadrilaterals c and f in FIG. 14(a), however, have extensions beyond the main body of the polygon and are likely horizontal conductors. Instead their direction is vertical like the other quadrilaterals. In an embodiment of the invention, the list of quadrilaterals is traversed after the importation process completes, and quadrilaterals that extend a significant distance further left or right than the quadrilaterals immediately before or after (i.e. those that have significant portions of their top and bottom faces exposed) and which have a very low aspect ratio (width to height) of the extension are sliced off and their directions changed from vertical to horizontal.

Figure 14B:
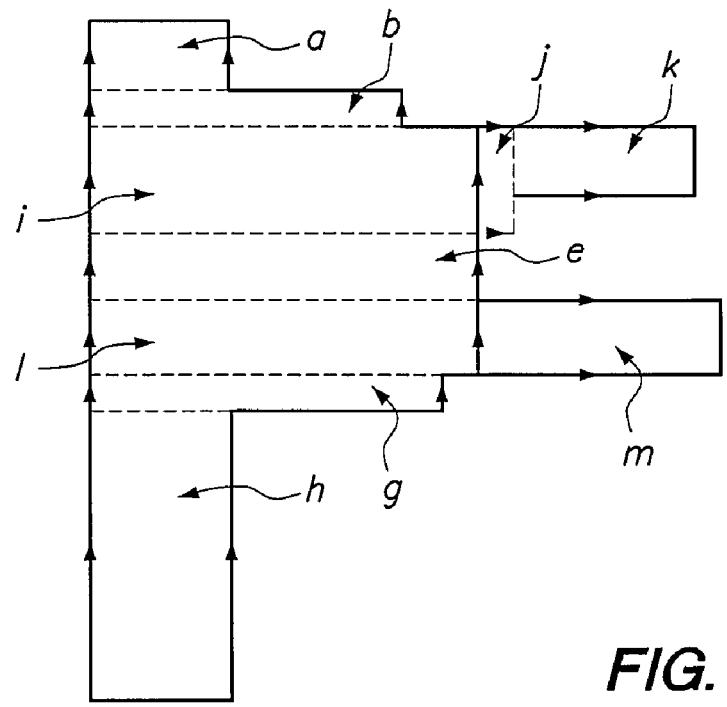

Quadrilaterals k and m in FIG. 14(b) have been sliced in this manner. Also shown is a new quadrilateral j formed from the rightmost portion of quadrilateral d in FIG. 14(a) and the portion of quadrilateral c that is just to the left of the new quadrilateral k. The remainder of quadrilaterals c and d in FIG. 14(a) are merged to form a new quadrilateral i. Quadrilaterals j and k are connected in a sequence that is linked to the side of quadrilateral i. Quadrilateral j is formed because its width would be close to that of quadrilateral k, such that the direction of current flow would still be rightward.

Once the extensions of the body of the polygon have been sliced off, the remainder of the body is evaluated to determine whether it also represents a conductor that heads in a direction perpendicular to the direction of the quadrilaterals. In FIG. 14(b), for example, the conductor represented by the quadrilaterals a and h, plus the extension through the quadrilaterals i, e, l, and g, is significantly narrower than the quadrilaterals i, e, l, and g. This suggests that the flow of current diverges here.

Figure 14C:
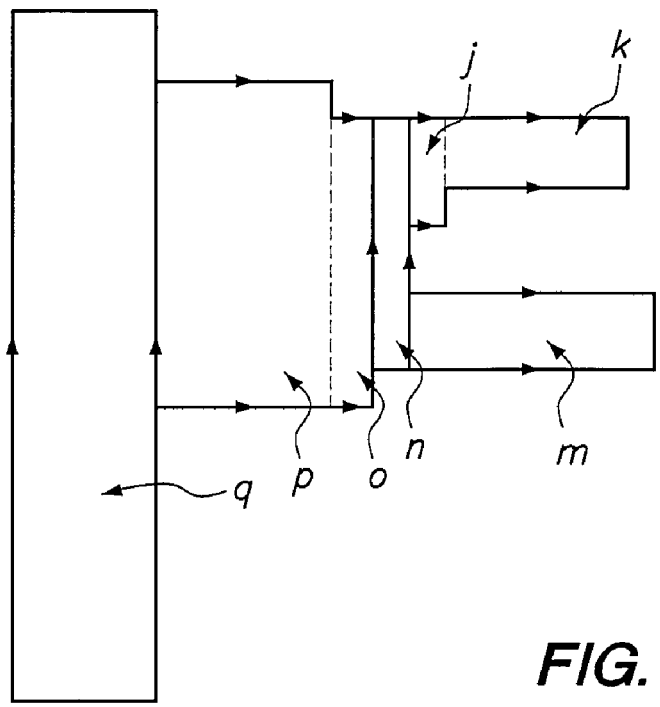

In an embodiment of the invention, an additional slicing operation of quadrilaterals i, e, l, and g is performed. As shown in FIG. 14(c), a new quadrilateral q is created to represent the vertical current path and the leftmost portions of the quadrilaterals are merged to form a new quadrilateral p for the horizontal current path. New quadrilaterals n and o are formed from the narrower portions of the current path. In an embodiment of the invention where only one quadrilateral sequence may be connected to the end of another quadrilateral sequence but multiple quadrilateral sequences may be connected to the side of a quadrilateral sequence, the direction of quadrilateral n is switched from horizontal to vertical. The end of the quadrilateral sequence containing quadrilaterals o and p is associated with the left side of quadrilateral n. The start of the quadrilateral sequence containing quadrilaterals j and k is associated with the right side of quadrilateral n, as is the start of the quadrilateral sequence containing quadrilateral m.

Figure 14D:
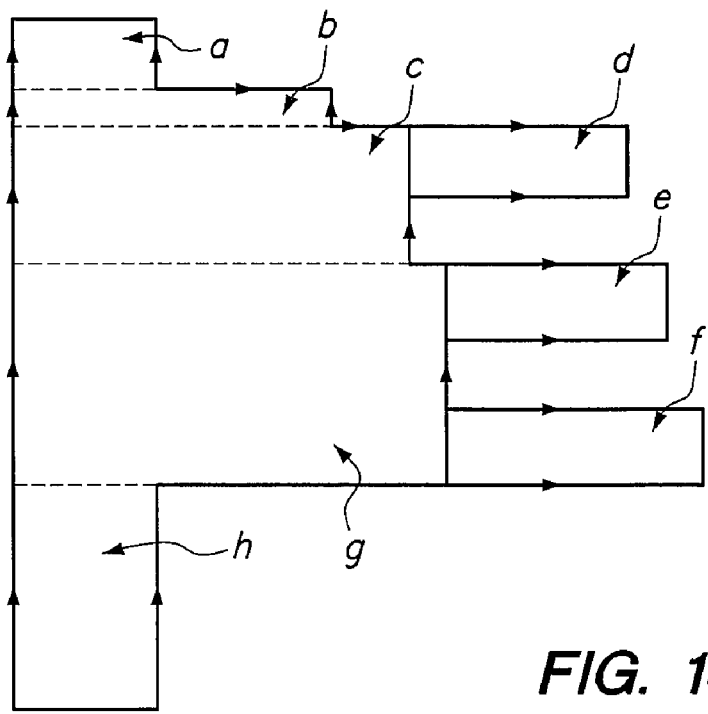

If the side of the polygon is sufficiently complex, it will not be possible to create a single quadrilateral such as n in FIG. 14(c) and still meet the requirement that the end of a quadrilateral sequence be associated with at most one other quadrilateral sequence. In this event the final slicing operation will not be performed and the quadrilateral sequence will continue in its original direction, as shown in FIG. 14(d). No single quadrilateral can be formed that would have all of the new quadrilaterals d, e, and f as its right side. As a result, the vertical conductor is still composed of multiple quadrilaterals a, b, c, g, and h.

Due to clipping of edges on the other side of the polygon, it may be necessary to merge more than one quadrilateral at a time when forming the new conductor. In FIG. 14(c) the rightmost edge of each of the new quadrilaterals comes from a single quadrilateral in FIG. 14(a), but there could be more than one quadrilateral if clipping is needed due to irregularities on the left side of the polygon in addition to irregularities on the right side.

Similar methods may be applied for conductors extending out of the left side of the quadrilateral sequence. The quadrilateral sequence may proceed in any direction without affecting the methods used to slice it into multiple sequences, and the new quadrilaterals may aim either left or right relative to the direction of the quadrilateral sequence.

In an embodiment of the invention where line segments may have "must be wire start or end segment" or "must be wire side segment" flags, slicing for new conductors may not be performed if such slicing would cause the flags to be violated. Similarly, "do not split" flags on line segments within the quadrilaterals must be honored.

Figure 15:
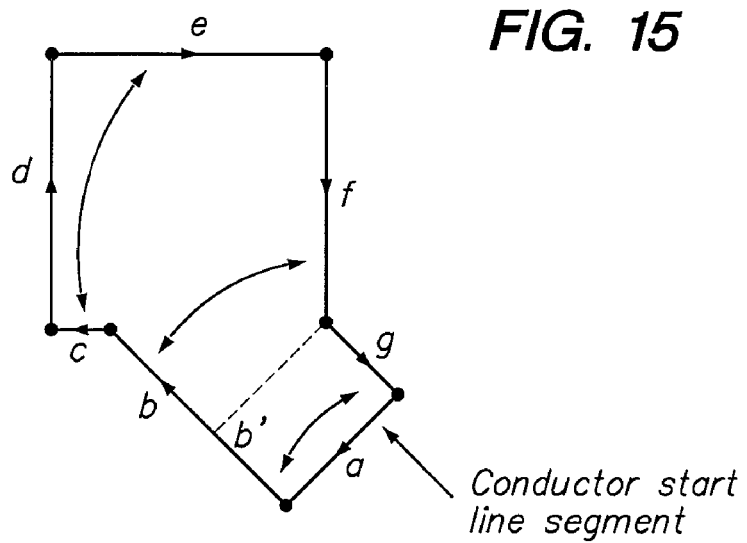
FIG. 15 illustrates how polygon processing efficiency may be improved by clipping edges in an embodiment of the invention.

As described earlier, at each line segment in the polygon importation process, multiple alternatives are evaluated. Frequently one side of a conductor will be straight while the other side is irregular. Unconditional matching of pairs of line segments will thus lead to a situation where the only available line segments for matching do not form a valid quadrilateral. For example, in FIG. 15 line segments b and g will be matched to form a convex quadrilateral, but line segments c and f will not form a convex quadrilateral because one endpoint of line segment f is colinear with line segment c. If line segment b is instead clipped at location b', as shown in FIG. 15, the upper portion of the line segment can be matched with line segment f and line segments c and e can be matched to complete the process.

This can improve efficiency as not all of the alternatives will need to be examined. Here also a slicing operation can be avoided, minimizing the total number of sequences of quadrilaterals.

In an embodiment of the invention, the preferred choice on the longer line segment is a point that is perpendicular to the furthest point on the shorter line segment, so that the quadrilateral has a right angle on the side constructed from a portion of the longer line segment. Many different locations on the longer line segment will be valid.

In an embodiment of the invention, the methods described are used in the construction of "join points" that represent the geometry surrounding a connection within a net routed in an integrated circuit. A join point object is responsible for managing its geometric representation so that the routed connections between join points may be simplified and that the advantages of non-overlapping geometry may be maintained. In an embodiment of the invention as described in U.S. Pat. No. 7,065,729, "Approach for Routing an Integrated Circuit,"

the content of which are hereby incorporated herein by reference for all purposes, join points construct sequences of quadrilaterals by creating polygons that trace around the managed regions and then converting the polygons to quadrilaterals, rather than attempt to generate the quadrilaterals directly.

For example, in FIG. 12(a) the addition of a "must be wire side segment" flag to line segment f, when such a flag already exists on line segment d, requires that the polygon be sliced to provide a direction change. Without the ability to slice the polygon, the join point would have to manage the "must be wire side segment" and "must be wire start or end segment" flags in such a way that it could generate sequences of quadrilaterals. This capability would have to be implemented redundantly in many of the join point types.

In another embodiment of the invention, polygon layout generated by a human layout designer or an automated routing method such as a channel router or area router can be converted to linked sequences of quadrilaterals suitable for use in a router such as that described in U.S. Pat. No. 7,065,729.

Figure 16A:
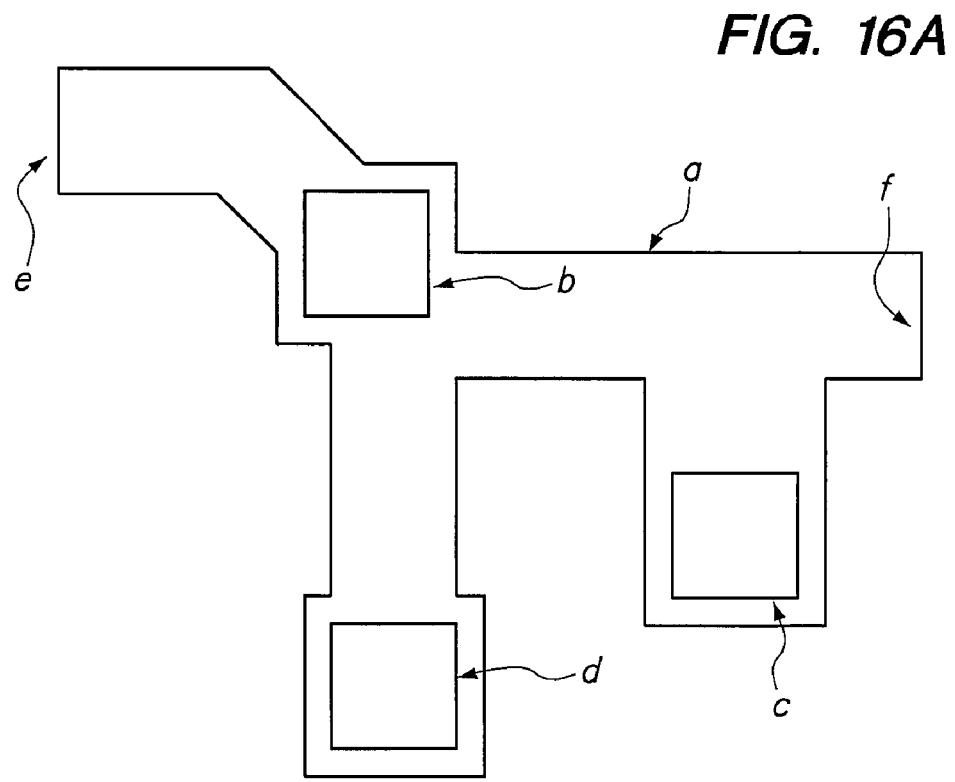
FIGS. 16(a)-16(c) illustrate how an embodiment of the invention may split a single polygon into independent polygons, each associated with a different routing path.
Figure 16B:
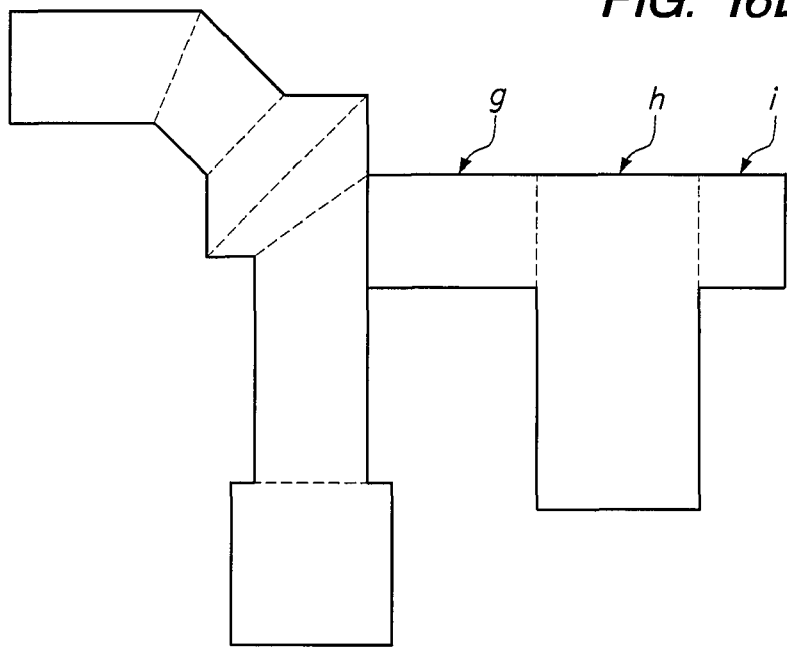

First, all overlapping geometry is removed and abutting polygons merged to form point lists as shown in FIG. 2, using for example a plane sweep algorithm or another of a variety of methods. Then each polygon generated by this step, such as polygon a shown in FIG. 16(a), is converted to sequences of quadrilaterals using the methods described above. One possible output from this step is shown in FIG. 16(b), where dashed lines represent boundaries between quadrilaterals (wire segments) within a wire and solid lines represent boundaries between wires.

Next, any corrections necessary to deal with inaccuracies in current flow direction are made, as described above for FIG. 14(a) through FIG. 14(d). In FIG. 16(b), quadrilateral h will be sliced to create a second quadrilateral below a first quadrilateral representing the horizontal conductor. The upper portion of quadrilateral h may either be merged with quadrilaterals g and i, forming a single horizontal quadrilateral, or retained separately. As will be seen, it is advantageous not to perform the merge.

Once corrections are made, additional information from the polygon layout is used to help identify the location of join points. In FIG. 16(a), this additional information comprises the contact polygons b, c, and d plus the cell interface records e and f, which are designed to abut similar geometry in an adjacent cell. The additional information is associated with the quadrilaterals within the linked sequences by looking for overlaps and abutment. Each piece of additional information will be associated with one or more quadrilaterals. Overlaps and abutments between the additional information and the quadrilaterals in the respective sequences are located using, for example, region queries, plane sweep algorithms, sequential traversals of the quadrilateral sequences, or other suitable approaches.

Figure 16C:
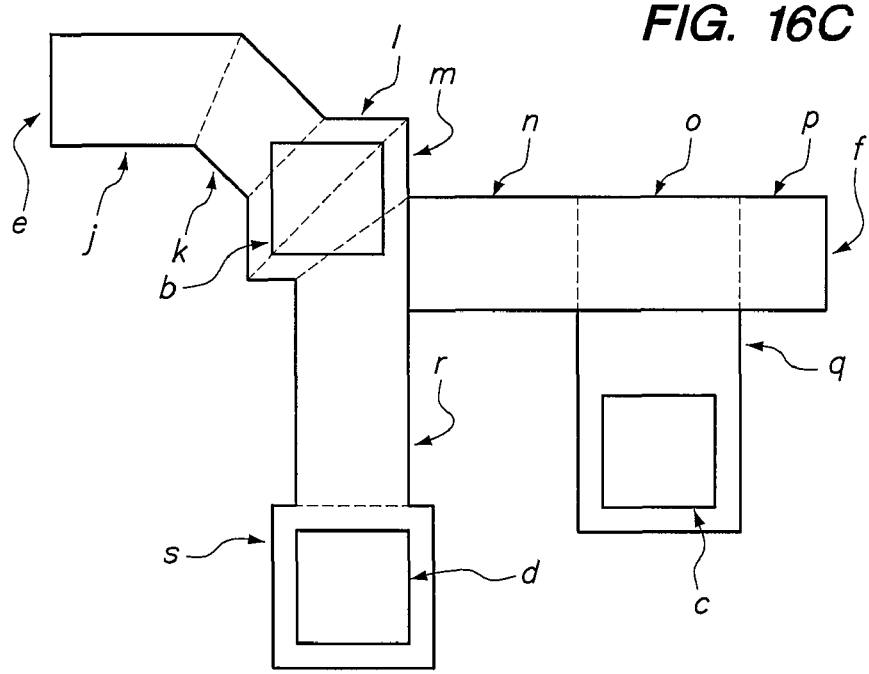

In FIG. 16(c), cell interface record e abuts and therefore is associated with quadrilateral j; cell interface record f abuts and therefore is associated with quadrilateral p; contact polygon b overlaps and therefore is associated with quadrilaterals k, l, m, and r; contact polygon c overlaps and therefore is associated with quadrilateral q; and contact polygon d overlaps and therefore is associated with quadrilateral s. Quadrilateral h in FIG. 16(b) has been sliced into quadrilaterals o and q in FIG. 16(c).

In a router such as that described in U.S. Pat. No. 7,065,729, join points are constructed according to design rules for an integrated circuit fabrication process and have routing paths attached using a specified direction and offset relative to a reference point associated with the join point. Therefore, in an embodiment of the invention, the routing representation for a join point is constructed as follows:

1. Determine the type of join point, e.g. contact between layers, branching junction on a single layer, or cell interface record.
2. Construct a join point using the appropriate reference point, geometry on other layers, if any, and the design rules, such that the join point includes some geometry on the routing layer for the polygon being imported.
3. Select the join point geometry on the routing layer as the region of interest.
4. Identify the quadrilaterals of the imported polygon that overlap or abut this region of interest.
5. Identify the portions of these quadrilaterals that exit this region of interest.
6. For each of these portions:
    construct a line segment across the quadrilateral, between the two sides that generally follow the direction of current flow;
    compute the direction and offset of the line segment relative to the reference point of the join point;
    add the direction and offset to the list of attachments of the join point.
7. After all attachments have been generated, retrieve from the join point all of the line segments that form the exposed ends of the attachments.
8. For each of the exposed ends of the attachments:
    find the quadrilateral that contains or abuts the exposed end but is not fully contained within the polygon representation maintained by the join point;
    if the exposed end is not coincident with an edge of the quadrilateral, slice the quadrilateral so that it is coincident;
    associate the remaining portion of the quadrilateral, not overlapping any portion of the polygon representation maintained by the join point, with the attachment.
9. Remove all quadrilaterals of the imported polygon that overlap the polygon representation maintained by the join point.

Figure 17A:
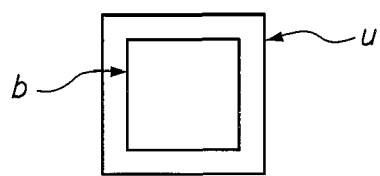
FIGS. 17(a)-17(d) illustrate how a router join point polygon may be constructed from the polygon of FIGS. 16(a)-16(d) using an embodiment of the invention.

FIGS. 17(a) through 17(d) show this process for contact polygon b:

FIG. 17(a) shows contact polygon b and its initial enclosure u as constructed by the join point prior to attaching any routing paths.

Figure 17B:
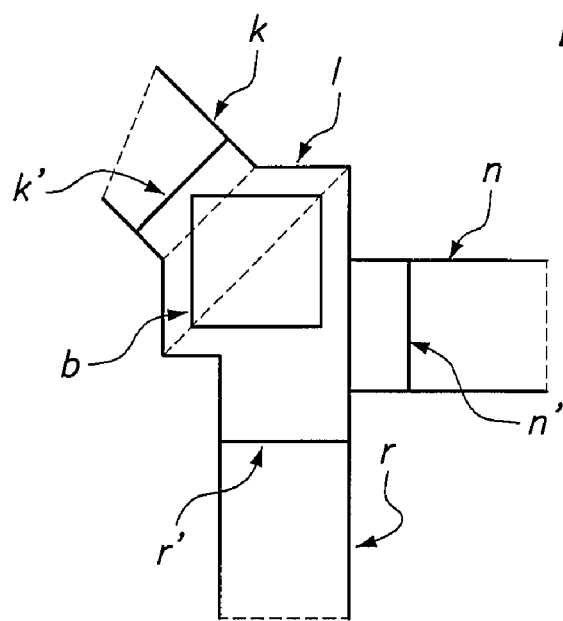

FIG. 17(b) shows the quadrilaterals that overlap or abut the enclosure u, the region of interest: k, l, m, n, and r. Quadrilaterals k, n, and r have portions that exit the region of interest; quadrilateral r has no portions actually inside the region but it does abut the region. Line segments k', n', and r' as constructed across the quadrilaterals k, n, and r are also shown.

Figure 17C:
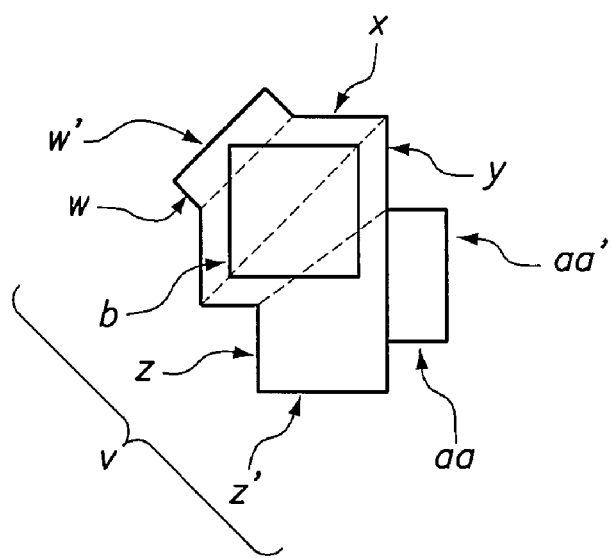

FIG. 17(c) shows a polygon v generated by a join point after attaching a routing path corresponding to each of the line segments. For reference, contact polygon b is also shown. In an embodiment of the invention, the polygon v contains two lists of quadrilaterals: a list containing quadrilaterals w, x, y, and z; and a list containing quadrilateral aa. The exposed ends of the attachments are marked as w', z', and aa'.

Figure 17D:
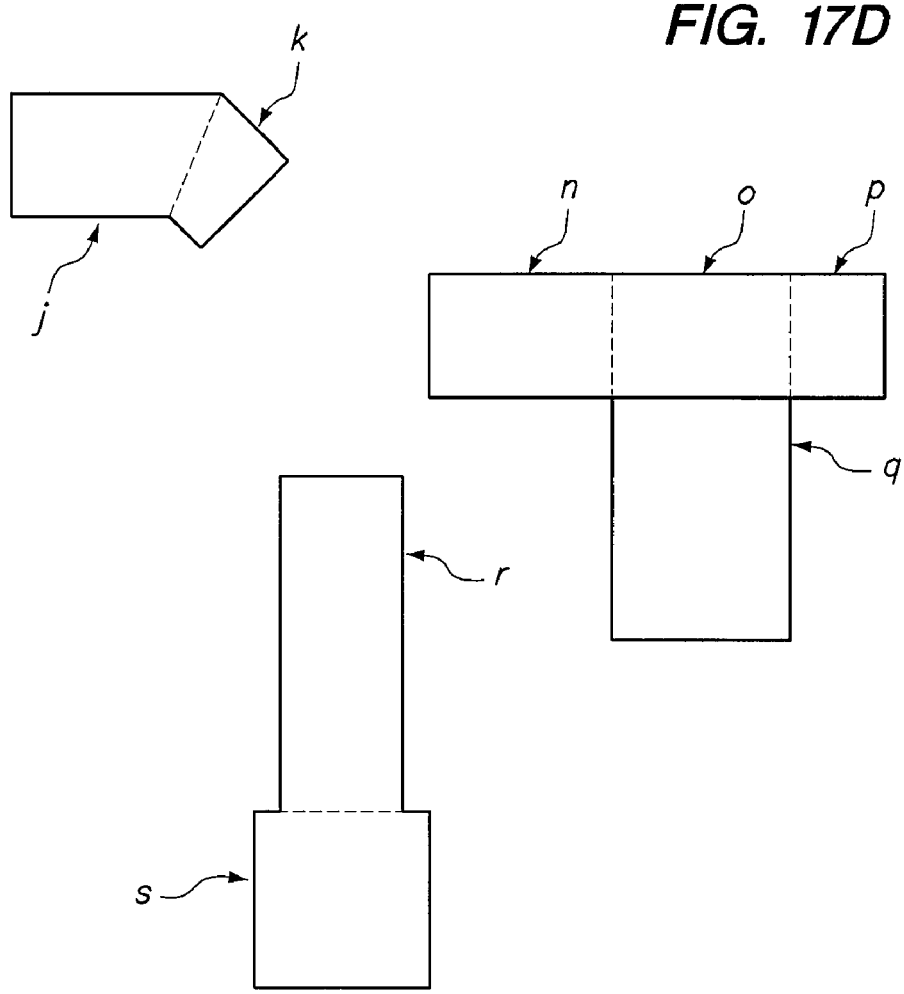

FIG. 17(d) shows the quadrilaterals of the imported polygon after quadrilaterals k, n, and r have been sliced to remove overlaps, and after quadrilaterals l and m have been removed. The lower right line segment of quadrilateral k abuts and is associated with attachment w' of FIG. 17(c); the left line segment of quadrilateral n abuts and is associated with attachment aa' of FIG. 17(c); and the upper line segment of quadrilateral r abuts and is associated with attachment z' of FIG. 17(c).

A similar process is followed for contact c; quadrilateral q will be sliced at its bottom so that it abuts and is associated with an attachment directed upward from the join point containing contact c. In like manner, quadrilateral r will be sliced at its bottom so that it abuts and is associated with an attachment directed upward from the join point containing contact d.

In an embodiment of the invention, quadrilateral o with its abutments to three adjoining quadrilaterals is used to form a branch join point, and quadrilateral q will be sliced so that it abuts and is associated with an attachment directed downward from the join point containing quadrilateral o. In this embodiment, no additional extension of the join point containing quadrilateral o is necessary along its longer axis, so neither quadrilateral n nor quadrilateral p are sliced to preserve abutment.

If quadrilaterals n, o, and p in FIG. 16(c) are merged, or if a single horizontal quadrilateral is formed because a slicing operation along to the conductor was performed as a result of the methods described above, then the presence of a second quadrilateral (e.g. q in FIG. 16(c)) adjacent to the merged quadrilateral is indicative of the need for a branch join point. The merged quadrilateral is sliced into three quadrilaterals and the center quadrilateral is used to form a branch join point as described above.

In an embodiment of the invention, quadrilateral j in FIG. 16(c) will abut and be associated with cell interface record e, and quadrilateral p in FIG. 16(c) will abut and be associated with cell interface record f. No slicing will be necessary in either case. In an embodiment of the invention, join points are associated with points in a graph within an integrated circuit router and the remaining quadrilateral sequences, between the join points, are associated with individual edges of the same graph within the integrated circuit router.

Figure 18:
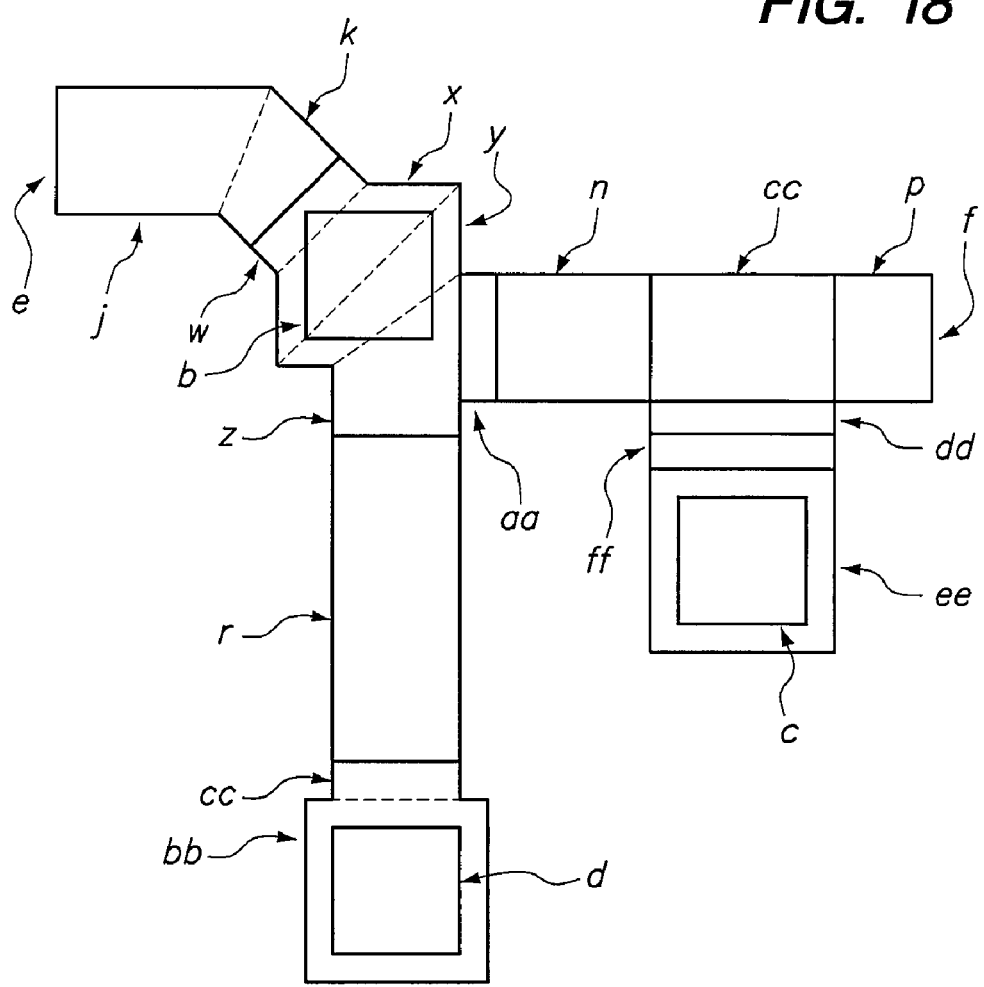
FIG. 18 illustrates the final set of polygons constructed for use in a router from the polygon of FIGS. 16(a)-16(d) by an embodiment of the invention.

The final representation of the polygon as separated for use in the router is shown in FIG. 18. The quadrilaterals w, x, y, x, and aa are associated with the join point containing contact b; the quadrilaterals cc and dd are associated with the branch join point located in the site once occupied by quadrilateral o in FIG. 17(d); the quadrilaterals bb and cc are associated with the join point containing contact d; and the quadrilaterals ee and ff are associated with the join point containing contact c.

Quadrilaterals j and k, contained in a sequence of quadrilaterals, are associated with the graph edge that connects the cell interface record e and the join point containing contact b; quadrilateral r is associated with the graph edge that connects the join points containing contacts b and d; quadrilateral n is associated with the graph edge that connects the join point containing contact b and the branch join point; quadrilateral p is associated with the graph edge that connects the branch join point and the cell interface record f; and there is no quadrilateral associated with the graph edge that connects the branch join point and the join point containing contact c because the two join points abut directly.

Although additional quadrilaterals are shown for use as attachment references from which to retrieve the exposed ends of the polygon data, other representations of attachment references are possible, such as marks associated with one or more portions of the line segments of a quadrilateral.

In an embodiment of the invention, a contact join point may include more than one contact polygon, each separated by a spacing less than a specified value. Such a contact join point may include a single line of contacts or a two-dimensional array of contacts. Once all of the associated contacts are identified, a contact join point containing all of them is constructed and the geometry for the specified routing layer is used in the manner described above.

In an embodiment of the invention, the final join point polygon is compared with the portions of the imported polygon that it overlaps, and if the join point polygon is smaller in a fashion that could be resolved by increasing one or more dimensions of the initial join point polygon, the join point is directed to increase the size of the initial join point polygon. This is useful e.g. for router connection points that are drawn larger than is necessary to meet the design rules of the integrated circuit fabrication process, such as for improvement of the yield of a design.

Figure 19:
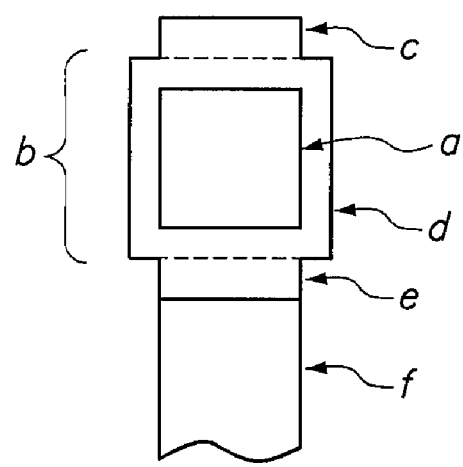
FIG. 19 illustrates how a join point polygon may be increased in size to match the original geometry by an embodiment of the invention.

An example is shown in FIG. 19. Contact a is associated with contact join point b, comprising quadrilaterals c, d, and e. A quadrilateral f associated with a routing graph edge abuts the bottom of the contact join. Quadrilateral c is not a requirement of the design rules for the fabrication process but such an extension is known to improve the yield of contacts between layers. It is desirous that such an extension be maintained if at all possible.

In an embodiment of the invention, the final join point polygon is compared with the portions of the imported polygon that it overlaps, and if the join point polygon is larger in a fashion that could be resolved by decreasing one or more dimensions of the initial join point polygon, the join point is directed to reduce the size of the initial join point polygon. This is useful e.g. for router connection points that have had a corner clipped to allow room for a nearby wire.

Figure 20:
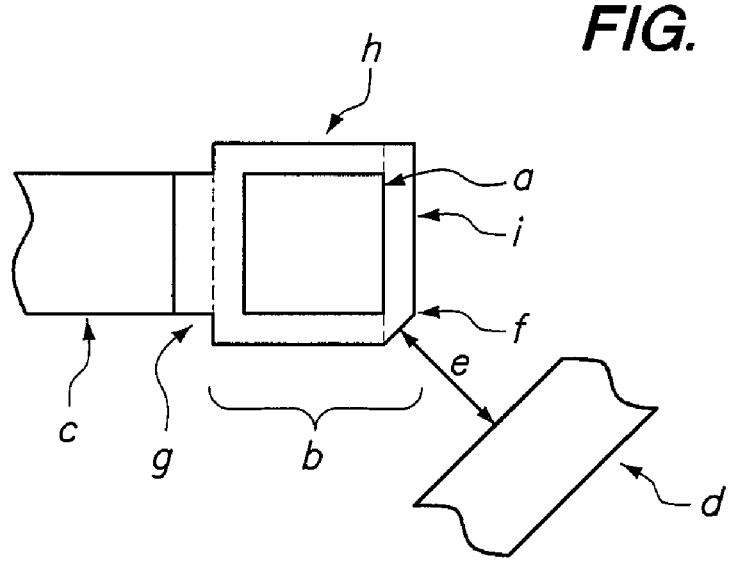
FIG. 20 illustrates how a join point polygon may be decreased in size to match the original geometry by an embodiment of the invention.

An example is shown in FIG. 20. Contact a is associated with contact join point b comprising quadrilaterals g, h, and i. Attached to the left side of the contact join is a routing path comprising quadrilateral c. Below and to the right of the contact join is a routing path d. The spacing e between the routing path and the contact join would be smaller, violating one of the fabrication process design rules, unless the routing path d were moved away from the contact join (thereby increasing the area required for this portion of the design) or the corner f was clipped.

When importing the layout geometry containing the contact join b and routing path c, it is advantageous to maintain the intent of the human designer or automated routing tool which clipped the corner; otherwise there would be a design rule violation as soon as the import process had completed.

Many router join points, such as contact descriptions, include more than one routing layer. When importing data for additional routing layers, the previously defined join point would be reused. After importing all layers, the join point would contain the union of all wire attachments.

Many of the FIGS. in this application depict line segments that are drawn at angles that are multiples of 90 degrees. Some line segments are drawn at angles that are multiples of 45 degrees. The approaches described herein apply equally to line segments drawn at angles that are neither multiples of 45 degrees nor multiples of 90 degrees.

The sequences of quadrilaterals created by matching and slicing operations may be linked to other sequences in a number of different ways, e.g. allowing end-to-end connections, not just side-to-end as in the present embodiment.

As described, the methods allow an integrated circuit router to import complex polygon data from another source, for example to complete unrouted portions of a design, fix remaining design rule violations, or to optimize a region for better manufacturing yield. This allows large-scale routing algorithms using simplified data representations to focus on resource management rather than attempting to solve every design rule violation or potential yield problem.

The methods can also be used within an advanced integrated circuit router, to allow it to generate complex join point polygons without concern for the precise quadrilateral-based representation. This division of responsibilities leads to software that is easier to manage and validate.

Various embodiments of the invention include:
methods to convert arbitrary polygon data into sequences of quadrilaterals for use within an integrated circuit router, without adding area to or removing area from that which was originally covered by the polygon data;
a fast method of determining all possible start line segments for a polygon; methods such as start line segment selection and polygon slicing to increase the efficiency of the conversion process without compromising its ability to convert complex polygons accurately;
methods to generate router data structures, e.g. router join points, from the converted sequences so that additional routing work may be performed on layout data that the router did not originally create;
methods by which router join points an integrated circuit router may use polygon conversion to generate sequences of quadrilaterals, so that the join points need not focus on the data representation;
methods by which router join points may constrain the polygon conversion process, to ensure that the converted polygon meets additional requirements set by the integrated circuit router.

According to one embodiment of the invention, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 21:
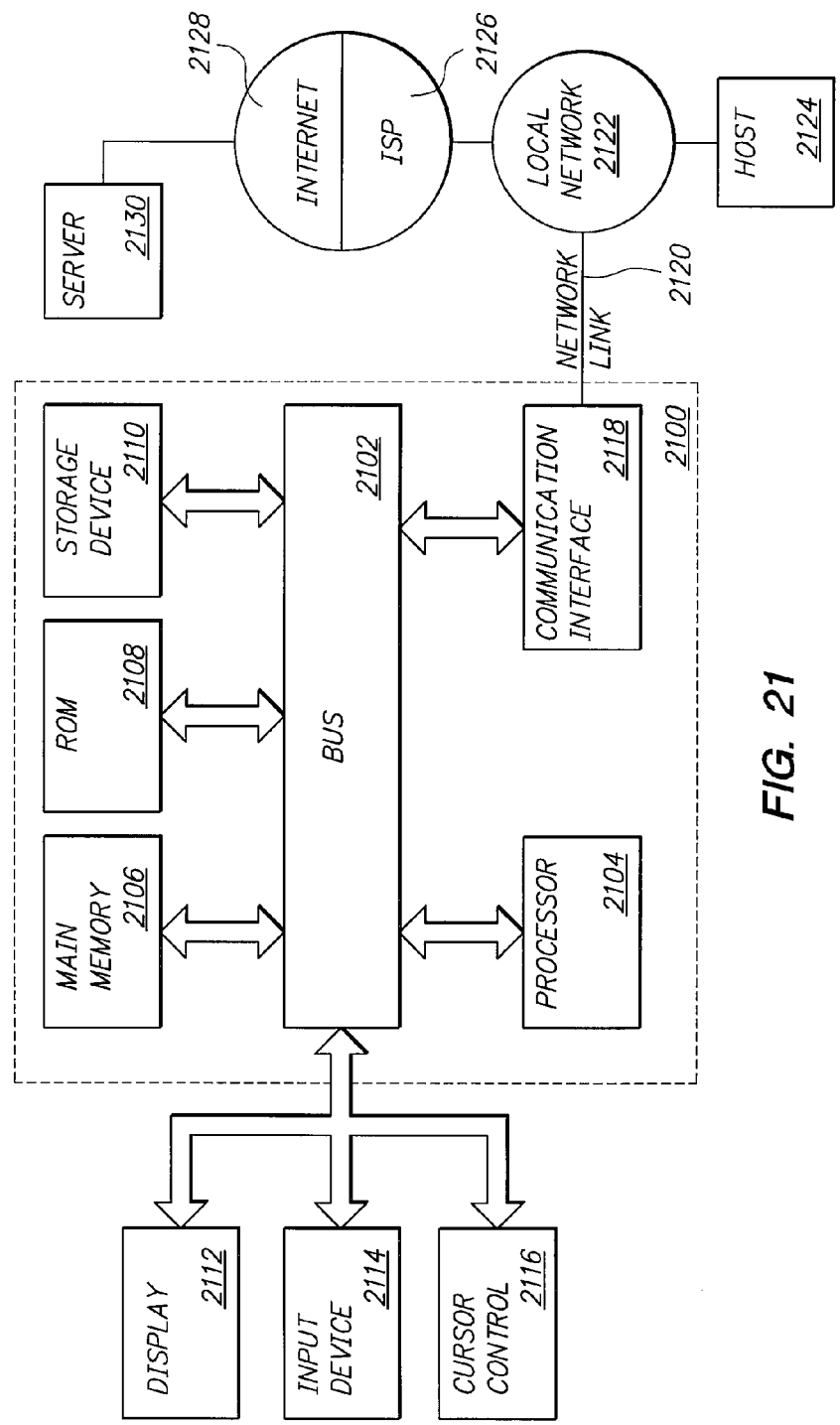
FIG. 21 is a block diagram that depicts an example computer system upon which embodiments of the invention may be implemented.

FIG. 21 is a block diagram that depicts an example computer system 2100 upon which embodiments of the invention may be implemented. Computer system 2100 includes a bus 2102 or other communication mechanism for communicating information, and a processor 2104 coupled with bus 2102 for processing information. Computer system 2100 also includes a main memory 2106, such as a random access memory (RAM) or other dynamic storage device, coupled to bus 2102 for storing information and instructions to be executed by processor 2104. Main memory 2106 also may be used for storing temporary variables or other intermediate information during execution of instructions to be executed by processor 2104. Computer system 2100 further includes a read only memory (ROM) 2108 or other static storage device coupled to bus 2102 for storing static information and instructions for processor 2104. A storage device 2110, such as a magnetic disk or optical disk, is provided and coupled to bus 2102 for storing information and instructions.

Computer system 2100 may be coupled via bus 2102 to a display 2112, such as a cathode ray tube (CRT), for displaying information to a computer user. An input device 2114, including alphanumeric and other keys, is coupled to bus 2102 for communicating information and command selections to processor 2104. Another type of user input device is cursor control 2116, such as a mouse, a trackball, or cursor direction keys for communicating direction information and command selections to processor 2104 and for controlling cursor movement on display 2112. This input device typically has two degrees of freedom in two axes, a first axis (e.g., x) and a second axis (e.g., y), that allows the device to specify positions in a plane.

Computer system 2100 may implement the techniques described herein using customized hard-wired logic, one or more ASICs or FPGAs, firmware and/or program logic or computer software which, in combination with the computer system, causes or programs computer system 2100 to be a special-purpose machine. According to one embodiment of the invention, those techniques are performed by computer system 2100 in response to processor 2104 executing one or more sequences of one or more instructions contained in main memory 2106. Such instructions may be read into main memory 2106 from another computer-readable storage medium, such as storage device 2110. Execution of the sequences of instructions contained in main memory 2106 causes processor 2104 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable storage medium" as used herein refers to any storage medium that participates in providing data that causes a computer to operation in a specific manner. In an embodiment implemented using computer system 2100, various computer-readable storage media are involved, for example, in providing instructions to processor 2104 for execution. Such a medium may take many forms, including but not limited to, non-volatile media and volatile media. Non-volatile media includes, for example, optical or magnetic disks, such as storage device 2110. Volatile media includes dynamic memory, such as main memory 2106. Common forms of computer-readable storage media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or memory cartridge, or any other medium from which a computer can read.

Various forms of computer-readable storage media may be involved in carrying one or more sequences of one or more instructions to processor 2104 for execution. For example, the instructions may initially be carried on a magnetic disk of a remote computer. The remote computer can load the instructions into its dynamic memory and send the instructions over a telephone line using a modem. A modem local to computer system 2100 can receive the data on the telephone line and use an infra-red transmitter to convert the data to an infra-red signal. An infra-red detector can receive the data carried in the infra-red signal and appropriate circuitry can place the data on bus 2102. Bus 2102 carries the data to main memory 2106, from which processor 2104 retrieves and executes the instructions. The instructions received by main memory 2106 may optionally be stored on storage device 2110 either before or after execution by processor 2104.

Computer system 2100 also includes a communication interface 2118 coupled to bus 2102. Communication interface 2118 provides a two-way data communication coupling to a network link 2120 that is connected to a local network 2122. For example, communication interface 2118 may be an integrated services digital network (ISDN) card or a modem to provide a data communication connection to a corresponding type of telephone line. As another example, communication interface 2118 may be a local area network (LAN) card to provide a data communication connection to a compatible LAN. Wireless links may also be implemented. In any such implementation, communication interface 2118 sends and receives electrical, electromagnetic or optical signals that carry digital data streams representing various types of information.

Network link 2120 typically provides data communication through one or more networks to other data devices. For example, network link 2120 may provide a connection through local network 2122 to a host computer 2124 or to data equipment operated by an Internet Service Provider (ISP) 2126. ISP 2126 in turn provides data communication services through the world wide packet data communication network now commonly referred to as the "Internet" 2128. Local network 2122 and Internet 2128 both use electrical, electromagnetic or optical signals that carry digital data streams.

Computer system 2100 can send messages and receive data, including program code, through the network(s), network link 2120 and communication interface 2118. In the Internet example, a server 2130 might transmit a requested code for an application program through Internet 2128, ISP 2126, local network 2122 and communication interface 2118. The received code may be executed by processor 2104 as it is received, and/or stored in storage device 2110, or other non-volatile storage for later execution.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory computer-readable storage medium for converting polygon data for a polygon in an integrated circuit layout from a sequence of points traversing a perimeter of the polygon into one or more sequences of quadrilaterals, the non-transitory computer-readable storage medium storing instructions which, when processed by one or more processors, causes:
   identifying one or more candidate start line segment sequences;
   selecting, from the one or more candidate start line segment sequences, a particular candidate start line segment sequence and an adjacent opposing pair of line segment sequences to form a first valid convex quadrilateral;
   matching sequences of opposing pairs of line segment sequences after a first opposing pair of line sequences, wherein the matched sequences of opposing pairs of line segment sequences form valid convex quadrilaterals;
   identifying a corrective action necessary to correct a non-convex or otherwise invalid quadrilateral;
   completing a sequence of quadrilaterals after performing the corrective action; and
   storing, in a memory, data that represents the sequence of quadrilaterals.

2. The non-transitory computer-readable storage medium of claim 1, wherein the corrective action includes splitting a particular member of a particular pair of opposing line segment sequences into segments that form a valid convex quadrilateral.

3. The non-transitory computer-readable storage medium of claim 2, wherein splitting a particular member of a particular pair of opposing line segment sequences into segments includes determining that the particular opposing line segment sequence is predicted to cause problems with matching of other pairs of opposing line segment sequences.

4. The non-transitory computer-readable storage medium of claim 1, wherein the corrective action includes skipping a particular member of a particular pair of opposing line segment sequence so that the particular member of the particular pair of opposing line segment sequences becomes part of a bottom of the next quadrilateral rather than a side.

5. The non-transitory computer-readable storage medium of claim 1, wherein the corrective action includes skipping both line segment sequences of a particular pair of opposing line segment sequences so that the particular pair of opposing line segment sequences becomes part of a bottom of the next quadrilateral rather than sides.

6. The non-transitory computer-readable storage medium of claim 1, wherein the corrective action includes reversing the matching of a pair of line segment sequences and performing a corrective action on a previous pair of matched line segment sequences.

7. The non-transitory computer-readable storage medium of claim 1, further storing additional instructions which, when processed by the one or more processor, causes the quadrilateral to be designated as invalid when one or more line segments marked "must be side" are part of the start or end face of the quadrilateral.

8. The non-transitory computer-readable storage medium of claim 1, further storing additional instructions which, when processed by the one or more processors, causes the quadrilateral to be designated as invalid when one or more line segments marked "must be start or end" are part of a side face of the quadrilateral.

9. The non-transitory computer-readable storage medium of claim 1, where the corrective action includes separating the single sequence of points into two sequences of points and associating the quadrilaterals of the sequence of points already processed with the quadrilaterals to be formed from the sequence of points not yet processed.

10. The non-transitory computer-readable storage medium of claim 9, where the associating includes marking one new line segment "must be side" and marking the other new line segment "must be end segment".

11. The non-transitory computer-readable storage medium of claim 1, where the set of candidate start line segment sequences is ordered according to a quality measure associated with each candidate start line segment sequence.

12. A non-transitory computer-readable storage medium for converting polygon data from an integrated circuit layout into a form usable by an integrated circuit router, the non-transitory computer-readable storage medium storing instructions which, when processed by one or more processors, causes:
   converting polygon data for a routing layer from a sequence of points traversing a perimeter of the routing layer into one or more sequences of quadrilaterals;
   receiving additional information that specifies one or more attributes of a router object;
   constructing a router join point from the additional information that specifies the one or more attributes of the router object;
   performing one or more of identifying overlaps on the routing layer between the one or more sequences of quadrilaterals and the router object and identifying abutments between the one or more sequences of quadrilaterals and the router object;
using quadrilaterals that exit one or more regions of overlap or abutment to define attachment records on the join point;
retrieving polygon data for the join point polygon on the routing layer; and
updating the polygon data for the join point polygon to remove overlaps between the join point polygon and the one or more sequences of quadrilaterals.

13. The non-transitory computer-readable storage medium of claim 12, further comprising additional instructions which, when processed by the one or more processors, causes adjusting the join point so that it matches non-attachment criteria.

14. The non-transitory computer-readable storage medium of claim 12, further comprising additional instructions which, when processed by the one or more processors, causes associating the attachment records on the join point with non-overlapping portions of the one or more sequences of quadrilaterals used to define the attachment records.

15. A non-transitory computer-readable storage medium for routing an integrated circuit, the non-transitory computer-readable storage medium storing instructions which, when processed by one or more processors, causes:
generating a sequence of line segments traversing a perimeter of a polygon for a layer of a join point in an integrated circuit layout;
associating one or more portions of one or more of the line segments with constraints; and
converting the sequence of line segments into one or more sequences of quadrilaterals such that the constraints are not violated.

16. A non-transitory computer-readable storage medium for determining a candidate start line segment sequence for a polygon of an integrated circuit layout, the non-transitory computer-readable storage medium storing instructions which, when processed by one or more processors, causes:
identifying a first sequence of one or more colinear line segments;
examining a second sequence of one or more colinear line segments immediately subsequent to the first sequence;
determining that the second sequence of one or more colinear line segments is directed in a first specified direction relative to the first sequence of one or more colinear line segments;
examining a third sequence of one or more colinear line segments immediately subsequent to the second sequence of one or more colinear line segments;
determining that the third sequence of one or more colinear line segments is directed in a second specified direction relative to the second sequence of one or more colinear line segments; and
selecting the second sequence of one or more colinear line segments as the candidate start line segment sequence.

17. The non-transitory computer-readable storage medium of claim 16, where the identifying a first sequence of one or more colinear line segments includes determining whether any of the colinear line segments in the first sequence of one or more colinear line segments have "must be start or end" markings immediately adjacent to the far end of the sequence.

18. The non-transitory computer-readable storage medium of claim 16, where the examining the second sequence of one or more colinear line segments includes determining whether any of the colinear line segments in the second sequence of one or more colinear line segments have any "must be side" markings.

19. The non-transitory computer-readable storage medium of claim 16, where the examining the third sequence of one or more colinear line segments includes determining whether any of the colinear line segments in the third sequence of one or more colinear line segments have any "must be start or end" markings immediately adjacent to the near end of the sequence.

20. The non-transitory computer-readable storage medium of claim 16, wherein the second specified direction is separated by at least approximately ninety degrees from a direction of the first sequence of one or more collinear line segments.

* * * * *